United States Patent
Angioni et al.

(10) Patent No.: US 11,309,506 B2
(45) Date of Patent: Apr. 19, 2022

(54) LIGHT-EMITTING DEVICE WITH CROSSLINKED EMISSIVE LAYER INCLUDING QUANTUM DOTS WITH LIGANDS BONDED THERETO

(71) Applicant: Sharp Kabushiki Kaisha, Osaka (JP)

(72) Inventors: Enrico Angioni, Oxford (GB); Isabel Arranz De La Calle, Madrid (ES); Tim Michael Smeeton, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 24 days.

(21) Appl. No.: 16/910,277

(22) Filed: Jun. 24, 2020

(65) Prior Publication Data
US 2021/0408416 A1 Dec. 30, 2021

(51) Int. Cl.
| H01L 29/08 | (2006.01) |
| H01L 51/50 | (2006.01) |
| H01L 51/56 | (2006.01) |
| C09K 11/02 | (2006.01) |
| B82Y 20/00 | (2011.01) |

(52) U.S. Cl.
CPC .......... *H01L 51/502* (2013.01); *C09K 11/025* (2013.01); *H01L 51/5056* (2013.01); *H01L 51/5072* (2013.01); *H01L 51/56* (2013.01); *B82Y 20/00* (2013.01); *H01L 2251/56* (2013.01)

(58) Field of Classification Search
CPC .................................................. H01L 51/502
See application file for complete search history.

(56) References Cited

U.S. PATENT DOCUMENTS

| 6,251,303 B1 * | 6/2001 | Bawendi | ................ | B82Y 15/00 |
| | | | | 252/301.4 R |
| 7,910,400 B2 | 3/2011 | Kwon et al. | | |

(Continued)

FOREIGN PATENT DOCUMENTS

| IN | 201747022708 A | 7/2017 |
| WO | WO 2017/117994 A1 | 7/2017 |
| WO | WO 2017/121163 A1 | 7/2017 |

OTHER PUBLICATIONS

Park et al., Alternative Patterning Process for Realization of Large-Area, Full-Color, Active Quantum Dot Display (Nano Letters, 2016, pp. 6946-6953).

(Continued)

*Primary Examiner* — Caleb E Henry
(74) *Attorney, Agent, or Firm* — Renner, Otto, Boisselle & Sklar, LLP

(57) ABSTRACT

A light-emitting device includes an anode, a cathode, and a crosslinked emissive layer disposed between the anode and the cathode in which quantum dots are dispersed. The crosslinked layer includes a crosslinked material and quantum dots dispersed in the crosslinked mater, the quantum dots having ligands respectively bonded to the quantum dots. The quantum dots are distributed unevenly within the crosslinked material. The ligands have a concentration relative to the weight of the quantum dots of 10 to 45 wt %. A method of forming a crosslinked emissive layer of a light-emitting device in which quantum dots are dispersed includes the steps of depositing a mixture on a deposition surface and subjecting at least a portion of the mixture to an activation stimulus to crosslink the cross-linkable material.

20 Claims, 14 Drawing Sheets

(56) References Cited

U.S. PATENT DOCUMENTS

| | | | | |
|---|---|---|---|---|
| 2003/0066998 | A1* | 4/2003 | Lee | B82Y 10/00 257/19 |
| 2004/0036130 | A1* | 2/2004 | Lee | G02B 6/1225 257/409 |
| 2007/0221947 | A1* | 9/2007 | Locascio | H01L 29/24 257/103 |
| 2017/0005226 | A1* | 1/2017 | Mangum | C09K 11/025 |
| 2017/0052444 | A1* | 2/2017 | Park | G03F 7/0042 |
| 2017/0059986 | A1* | 3/2017 | Jun | G03F 7/0007 |
| 2017/0155051 | A1 | 6/2017 | Torres Cano et al. | |
| 2017/0183565 | A1* | 6/2017 | Jun | C08K 3/32 |
| 2017/0192146 | A1* | 7/2017 | Yamada | G02B 6/0055 |
| 2018/0072942 | A1* | 3/2018 | Yamada | G02F 1/133621 |
| 2018/0072949 | A1* | 3/2018 | Satake | C09K 11/883 |
| 2018/0079868 | A1* | 3/2018 | Yamada | C09K 19/54 |
| 2018/0151817 | A1* | 5/2018 | Cho | H01L 51/0039 |
| 2019/0115507 | A1* | 4/2019 | Kim | H01L 33/28 |
| 2019/0144689 | A1* | 5/2019 | Yamada | C09K 11/883 349/71 |
| 2019/0218453 | A1* | 7/2019 | Qiu | C09K 11/02 |
| 2019/0276734 | A1* | 9/2019 | Kim | H01L 27/3244 |
| 2019/0296241 | A1* | 9/2019 | Chen | H01L 51/0003 |
| 2019/0305240 | A1* | 10/2019 | Angioni | H01L 33/06 |
| 2019/0305241 | A1* | 10/2019 | Angioni | H01L 51/56 |
| 2020/0063032 | A1* | 2/2020 | Kim | H01L 51/502 |
| 2020/0262979 | A1* | 8/2020 | Qiu | C08K 5/37 |
| 2020/0263083 | A1* | 8/2020 | Kim | C09K 11/025 |
| 2020/0266348 | A1* | 8/2020 | Kim | C09K 11/025 |
| 2020/0339876 | A1* | 10/2020 | Youn | C09K 11/025 |
| 2021/0043863 | A1* | 2/2021 | Jung | C09K 11/02 |
| 2021/0091327 | A1* | 3/2021 | Kim | H01L 51/502 |
| 2021/0265538 | A1* | 8/2021 | Wang | H01L 51/5281 |

OTHER PUBLICATIONS

Gaikwad et al., Identifying orthogonal solvents for solution processed organic transistors, Organic Electronics 30 (2016) pp. 18-29.

* cited by examiner

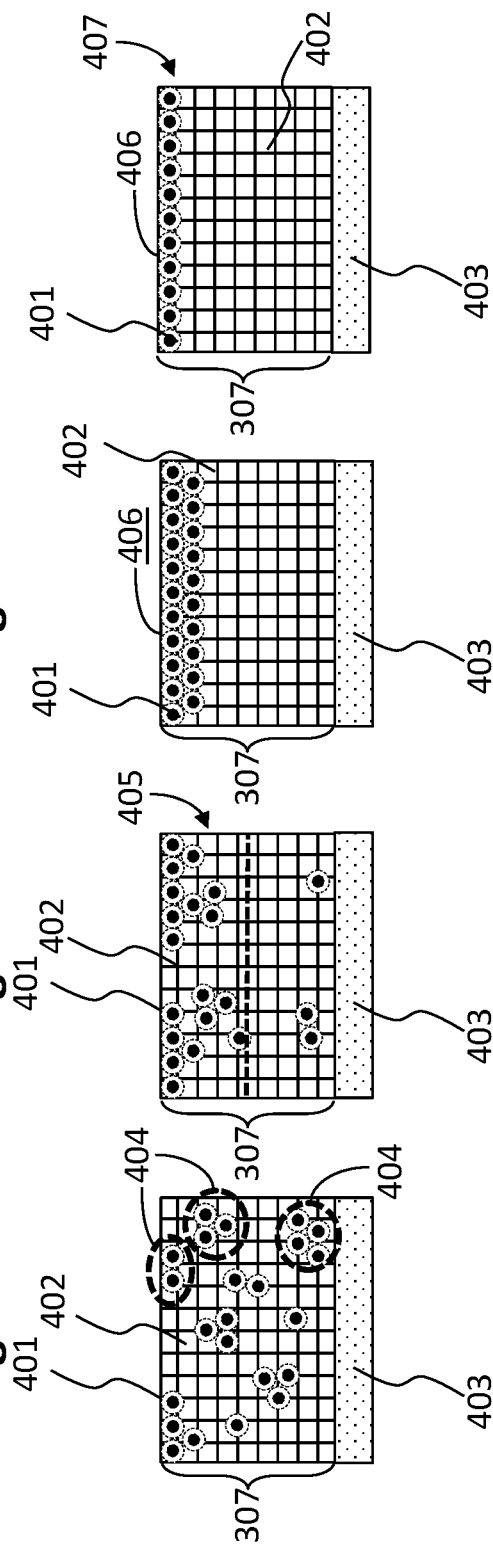

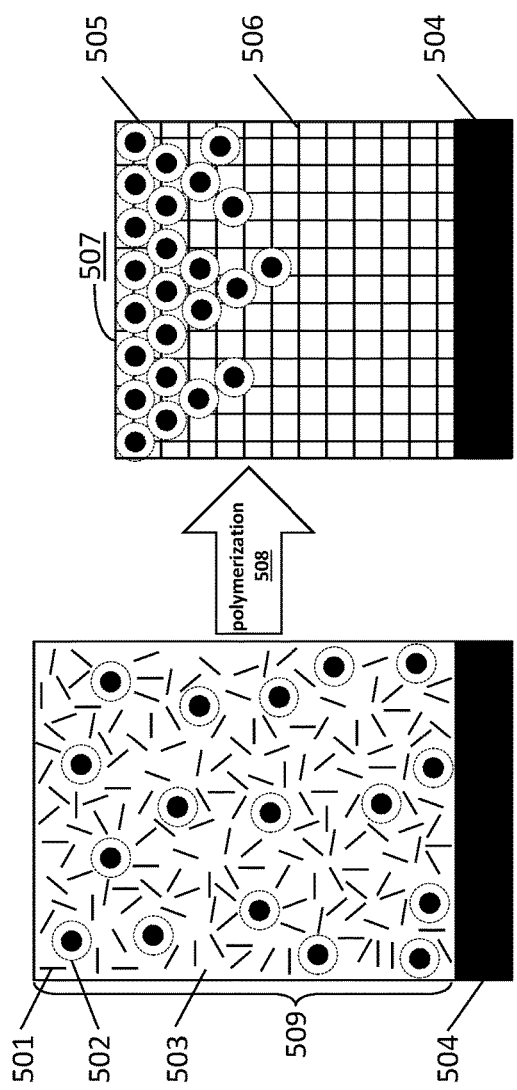
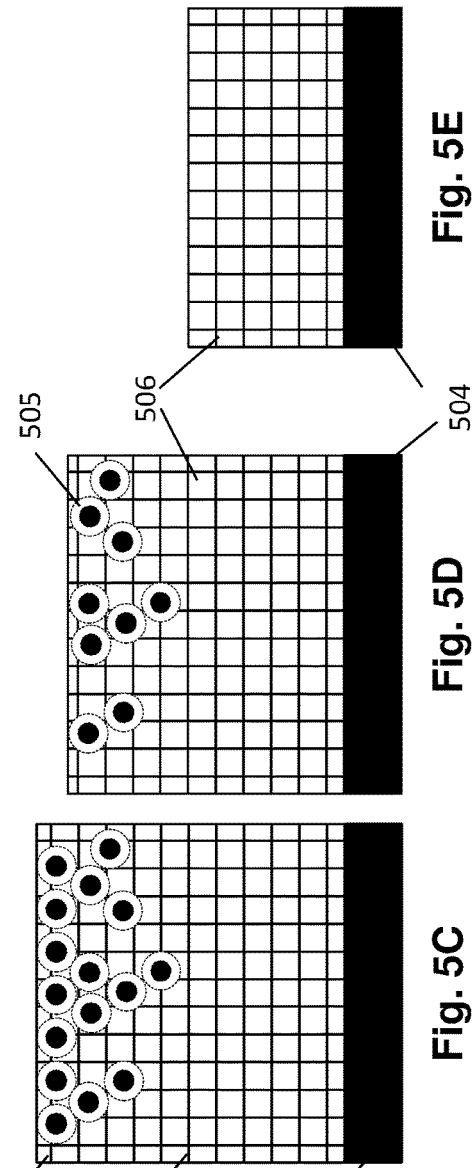

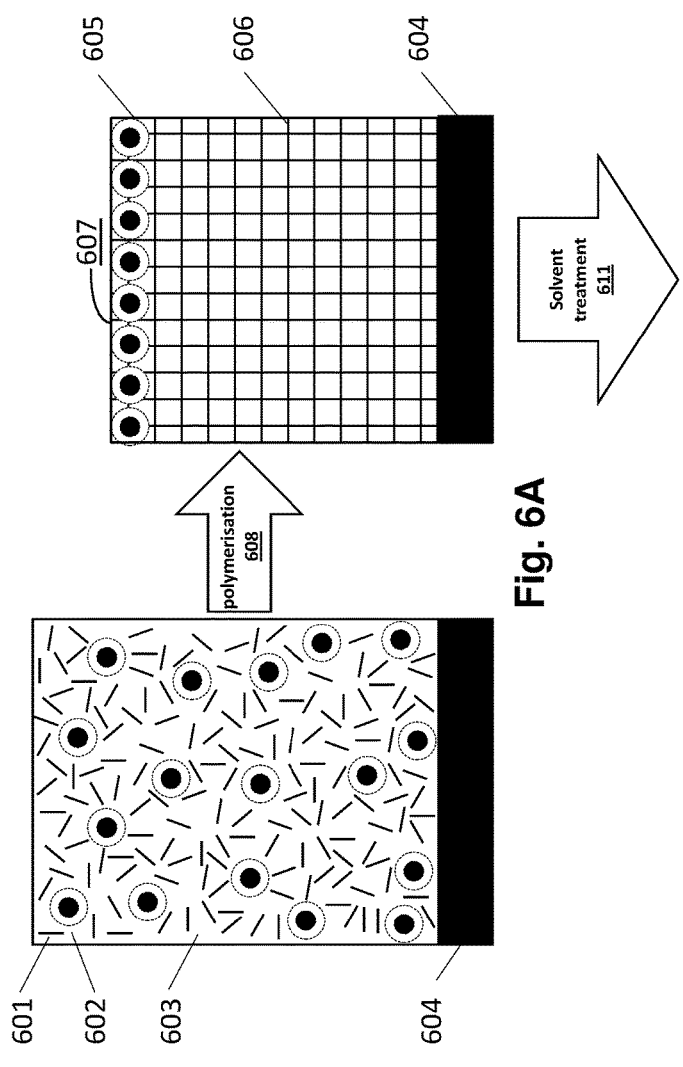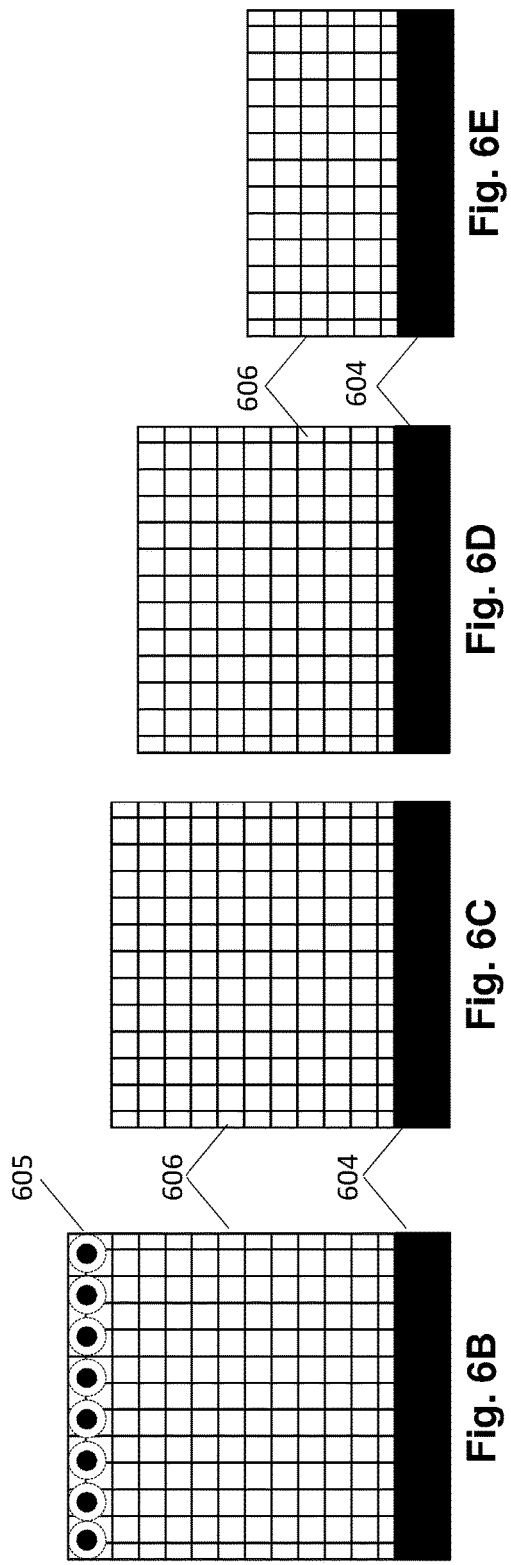

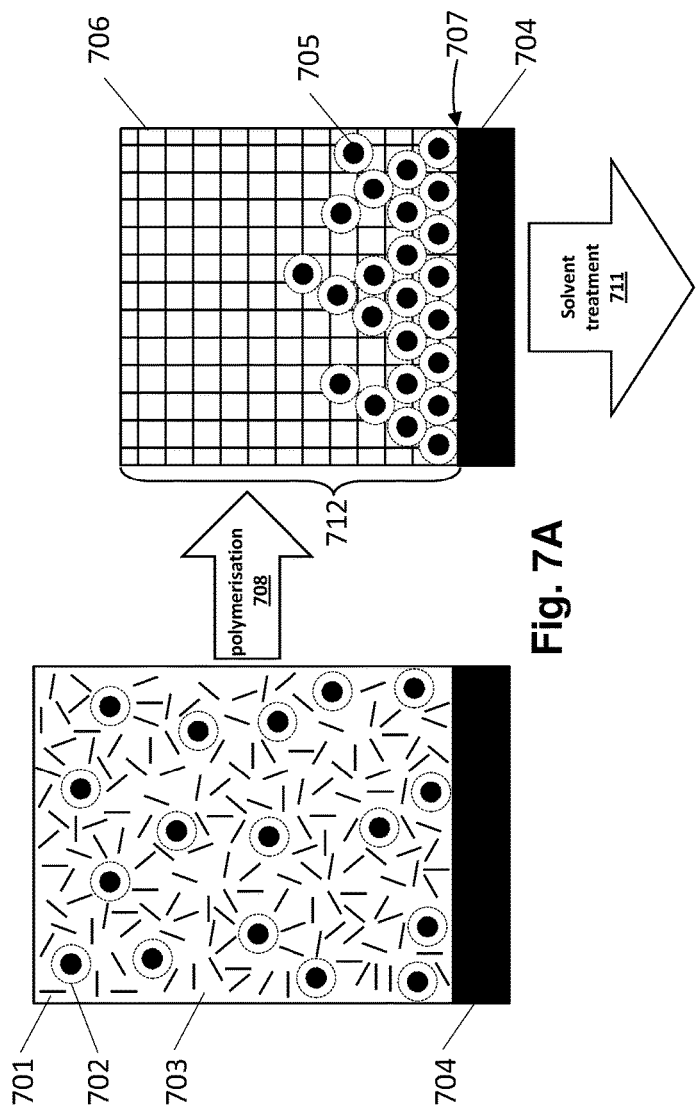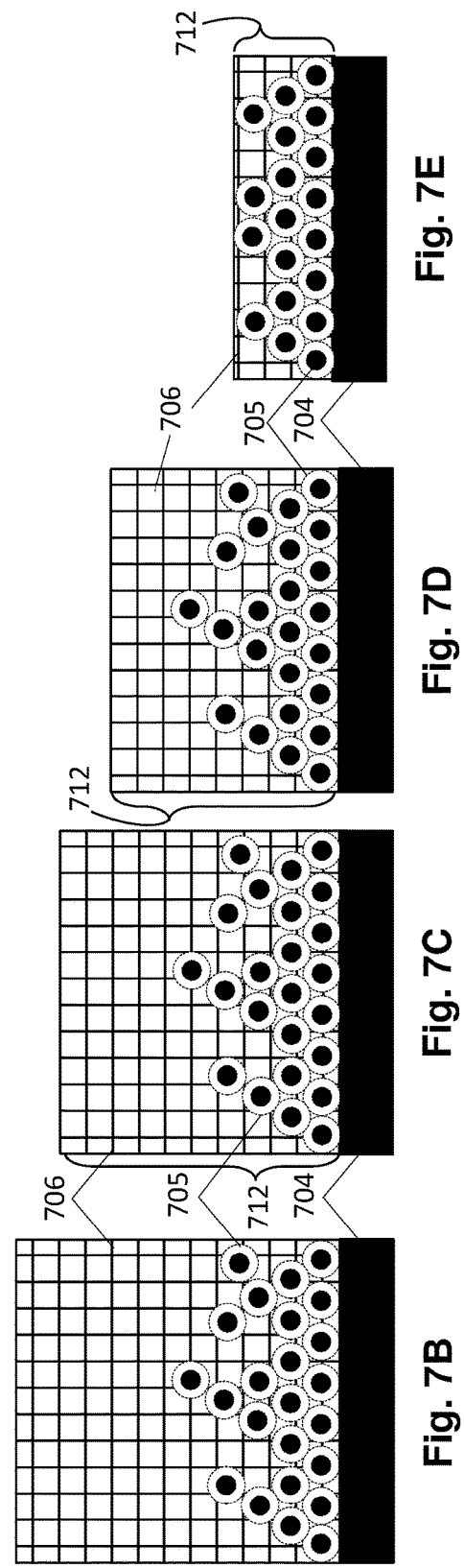

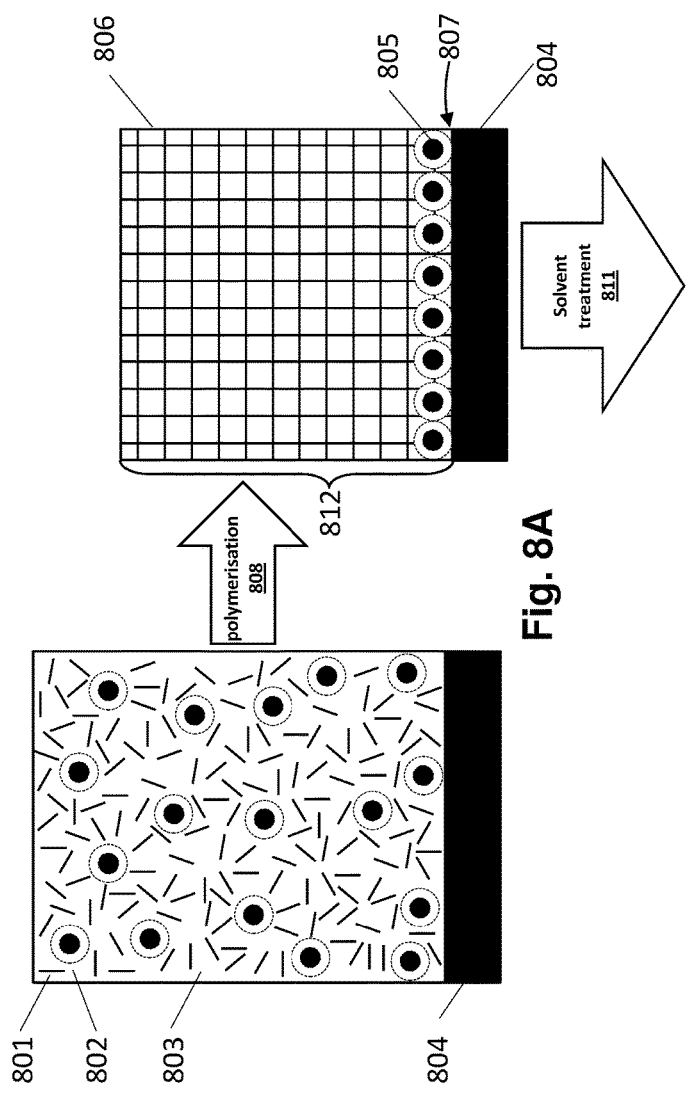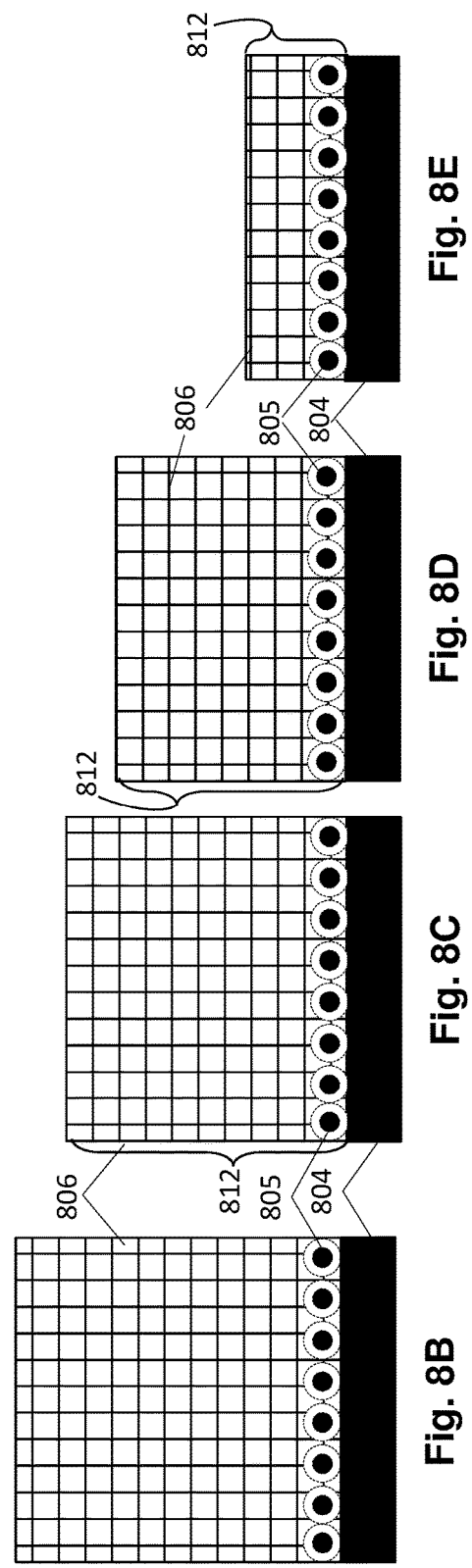

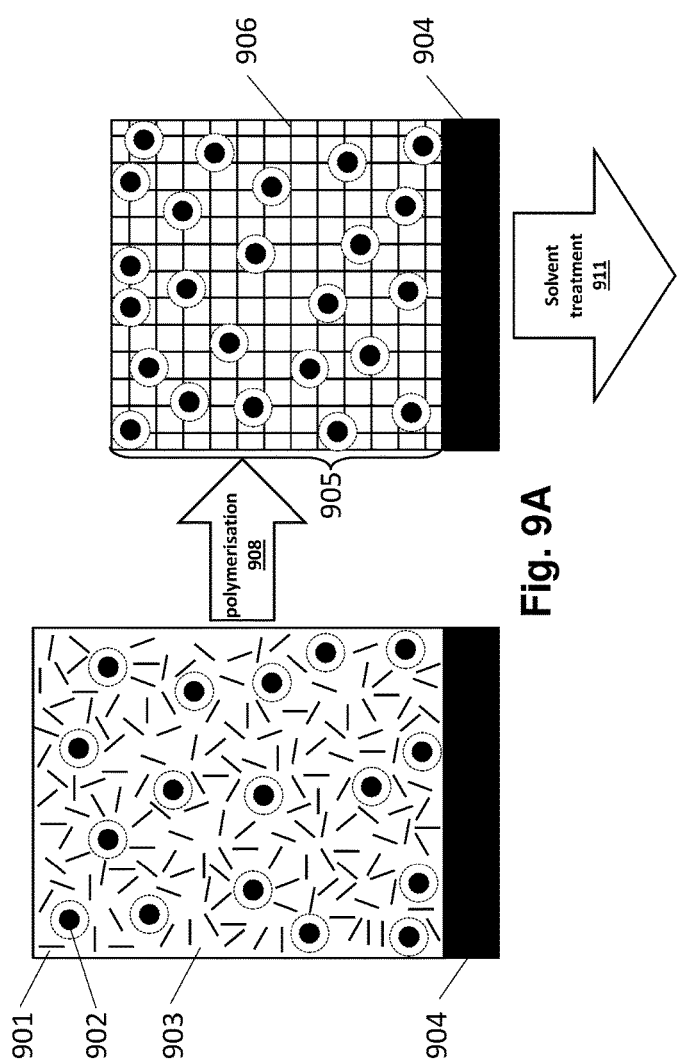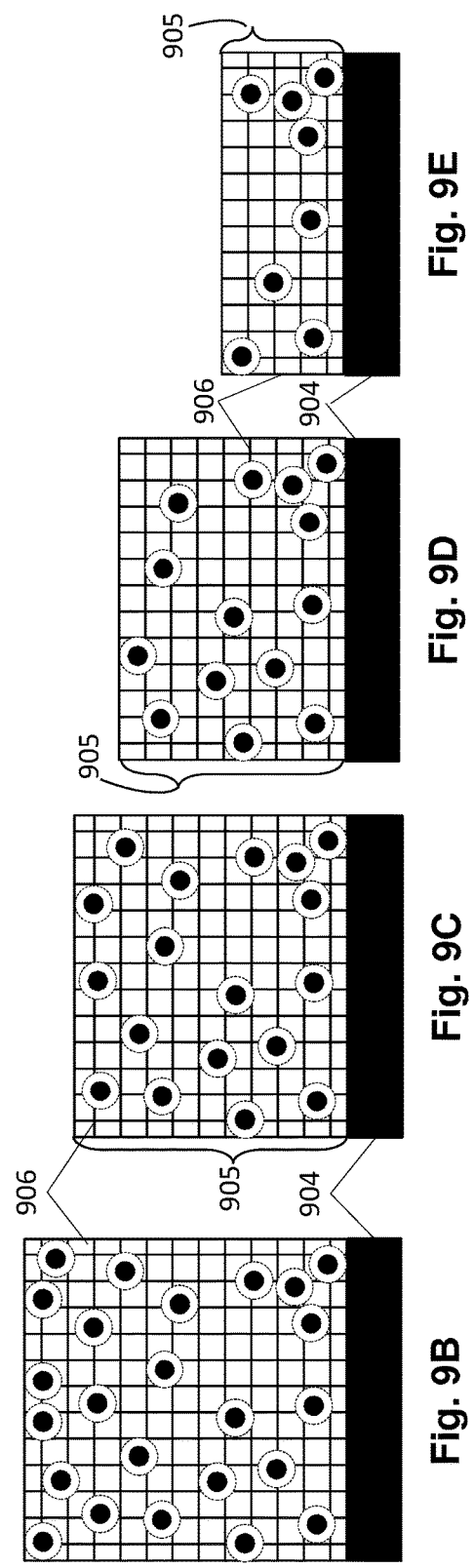

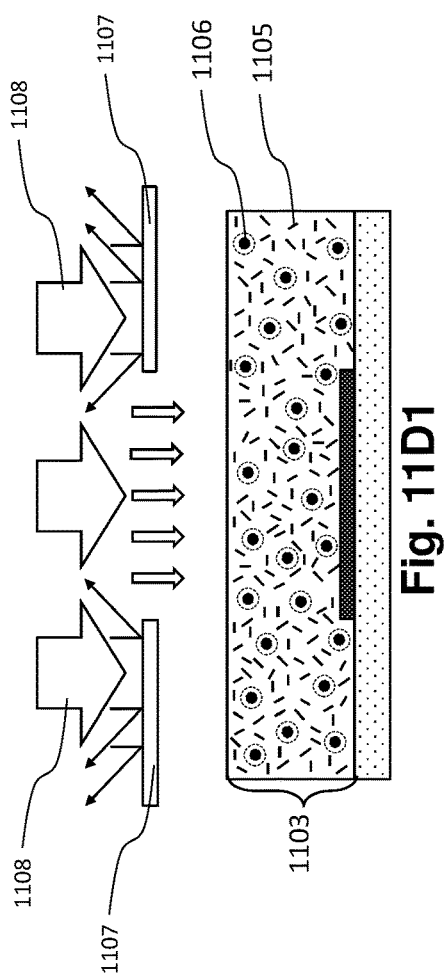
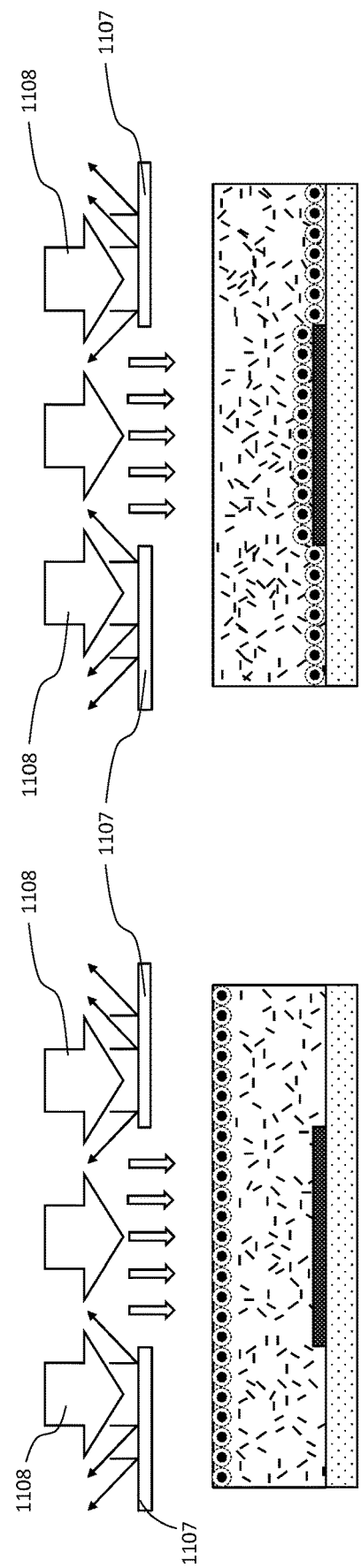
Fig. 11D1
Fig. 11D2
Fig. 11D3

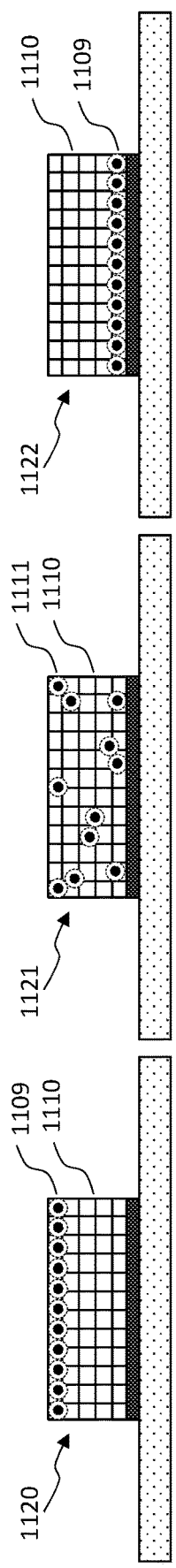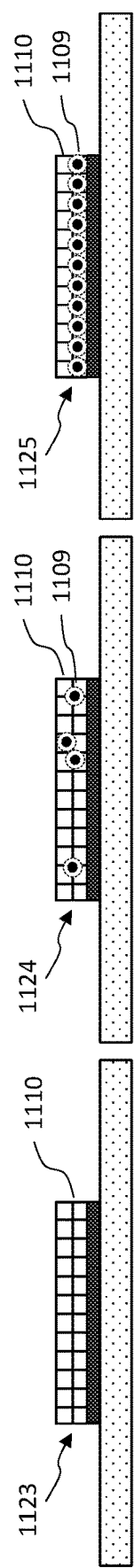

LIGHT-EMITTING DEVICE WITH CROSSLINKED EMISSIVE LAYER INCLUDING QUANTUM DOTS WITH LIGANDS BONDED THERETO

TECHNICAL FIELD

The present application relates to light-emitting devices, and in particular to light-emitting devices including a crosslinked emissive layer containing quantum dots. The light-emitting devices may be implemented in display applications, for example in high resolution, multicolor displays. The present application further relates to methods of fabricating such light-emitting devices.

BACKGROUND ART

A common architecture for a light-emitting device includes an anode, which acts as hole injector; a hole transport layer disposed on the anode; an emissive material layer disposed on the hole transport layer; an electron transport layer disposed on the emissive material layer; and a cathode, which also acts as an electron injector, disposed on the electron transport layer. When a forward bias is applied between the anode and cathode, holes and electrons are transported in the device through the hole transport layer and electron transport layer, respectively. The holes and electrons recombine in the emissive material layer, which generates light that is emitted from the device. When the emissive material layer includes an organic material, the light-emitting device is referred to as an organic light-emitting diode (OLED). When the emissive material layer includes nanoparticles, sometimes known as quantum dots (QDs), the device is commonly referred to as either a quantum dot light-emitting diode (QLED, QD-LED) or an electroluminescent quantum dot light-emitting diode (ELQLED, QDEL).

Each of the layers of the light-emitting device can be deposited by different methods with the common methods including thermal evaporation methods and solution process methods. Thermal evaporation methods are widely used for OLEDs, but they are more complex and have higher costs of fabrication as compared to solution process methods. Solution process methods are thus preferred as cheaper and simpler fabrication methods. In the fabrication of devices with these methods, it is important to find the appropriate solvents such that during the deposition of a layer, the process will not dissolve or otherwise damage the previously deposited layer. Such a non-damaging solvent is typically referred to in the art as "orthogonal" to the previous one (See, Organic Electronics 30 (2016) 18e29; http://dx.doi.org/10.1016/j.orgel.2015.12.008).

To include QLEDs in multicolor high-resolution displays, different manufacturing methods have been designed. These methods typically include depositing three different types of QDs on three different regions of a substrate such that each region emits light (through charge injection that causes electroluminescence) at three different colors, particularly red (R), green (G) and blue (B). Sub-pixels that respectively emit red, green, or blue light may collectively form a pixel, which in turn may be a part of an array of pixels of the display.

Various processing methods for improved manufacturing of such devices have been described. U.S. Pat. No. 7,910,400 (Kwon et al., issued Mar. 22, 2011) describes that QD films can be made more uniform using wet-type film exchanging ligand processes, in which QDs can be connected to each other using organic ligands with particular functional groups at both ends (e.g. thiol, amine, carboxyl functional groups). US 2017/0155051 (Torres Cano et al., published Jun. 1, 2017) describes that QDs can be synthesized with polythiol ligands, which can lead to better packing when deposited and further cured by thermal processes. WO 2017/117994 (Li et al., published Jul. 13, 2017) describes that through external energy stimuli (e.g. pressure, temperature or UV irradiation), QDs which emit different colors can be selectively attached to bonding surfaces. Surfaces and ligands of QDs must contain particular ending functional groups (e.g. alkenes, alkynes, thiols) to be selectively strongly bonded to each other through chemical reactions. This concept is further expanded in WO 2017/121163 (Li et al., published Jul. 20, 2017), in which QDs with R, G and B emission colors can be patterned separately using cross-linkable ligands and organic connectors through chemical reactions that are activated selectively with UV radiation applied at different monochromatic wavelengths. Park et al., Alternative Patterning Process for Realization of Large-Area, Full-Color, Active Quantum Dot Display (Nano Letters, 2016, pages 6946-6953) describes that QDs with R, G and B emission colors are patterned by combining conventional photolithography and layer by layer assembly. Park describes the deposition of QD layers selectively on activated (i.e., charged) surfaces.

SUMMARY OF INVENTION

The present application relates to an enhanced structure of a layer including Quantum Dots (QDs) dispersed in a cross-linked material. A layer including QDs dispersed in a cross-linked material is resistant to solvent rinsing and may improve patterned layers in the QLED field. This can be generally called a cross-linked layer in which quantum dots are dispersed (CLQDL). In some embodiments, the quantum dots are dispersed in, but do not form a part of, the cross-linked network of the cross-linked layer. In other embodiments, the quantum dots are dispersed in, and form a part of, the cross-linked network of the cross-linked layer. In embodiments where the cross-linked material is a charge transport material (e.g., hole transport material or electron transport material), this layer may also be referred to as a combined charge transport and emissive layer (CCTEL) of a QLED. The CCTEL may improve performance of existing QLEDs and may simplify fabrication by combining properties of a charge transport layer and an emissive layer.

A CCTEL (CLQDL) may be formed from a solution including QDs, cross-linkable material (e.g., charge transport material), and a solvent by cross-linking the cross-linkable material with the QDs dispersed therein. In some embodiments, the cross-linkable material is crosslinked to form a cross-linked network in which the quantum dots are dispersed (but where the quantum dots do not form a part of the cross-linked network). In other embodiments, the cross-linkable material and the QDs are crosslinked to form a cross-linked network in which the quantum dots are dispersed (where the quantum dots form a part of the cross-linked network). The QDs of the solution contain a specific concentration of ligands. Optionally this solution may include one or more initiators of the polymerization. The initiator can be defined based on an external stimulus that activates the initiator such as light, temperature, pressure, change in pH and the like.

In accordance with one aspect of the present disclosure, a light-emitting device includes: an anode; a cathode; and a crosslinked emissive layer disposed between the anode and the cathode in which quantum dots are dispersed, the crosslinked layer including a crosslinked material and quantum dots dispersed in the crosslinked mater, the quantum dots having ligands respectively bonded to the quantum dots; wherein the quantum dots are distributed unevenly within the crosslinked material; and wherein the ligands have a concentration relative to the weight of the quantum dots in a range of 10 to 45 wt %.

In some embodiments, the ligands have nucleophilic or electrophilic centers.

In some embodiments, the ligands have a concentration relative to the weight of the quantum dots in a range of 15 to 35 wt %.

In some embodiments, at least 75% of the quantum dots are located in a half portion of the combined charge transport and emissive layer closest to the cathode.

In some embodiments, the quantum dots form a monolayer of quantum dots at an outer surface of the crosslinked layer closest to the cathode.

In some embodiments, at least 75% of the quantum dots are located in a half portion of the combined charge transport and emissive layer closest to the anode.

In some embodiments, the quantum dots form a monolayer of quantum dots at an outer surface of the crosslinked layer closest to the anode.

In some embodiments, at least 75% of the quantum dots are arranged in groupings of two or more.

In some embodiments, the crosslinked material includes a hole transport material and the crosslinked emissive layer is a combined charge transport and emissive layer.

In some embodiments, the crosslinked material includes an electron transport material and the crosslinked emissive layer is a combined charge transport and emissive layer.

In some embodiments, the light-emitting device further includes a hole transport layer disposed between the anode and the crosslinked layer.

In some embodiments, the light-emitting device further includes an electron transport layer disposed between the cathode and the crosslinked layer.

In some embodiments, the crosslinked layer further includes one or more photo initiators.

In accordance with another aspect of the present disclosure, a bank structure of multiple light-emitting devices includes: a first light emitting device and a second light emitting device, each of the first and second light emitting devices being a light emitting device according to any of the above-described embodiments of the light-emitting device; and an insulating material that separates at least a portion of the first light-emitting device from the second light-emitting device; wherein the first light-emitting device and the second light-emitting device are configured to emit wavelengths of different color.

In some embodiments, the bank structure further includes a third light emitting device, the third light emitting device being a light emitting device according to any of the above-described embodiments of the light-emitting device, wherein the insulating material separates at least a portion of the third light-emitting device from the first and second light-emitting devices; and the third light-emitting device is configured to emit different color light than each of the first light-emitting device and the second light-emitting device.

In some embodiments, the first light-emitting device and the second light-emitting device share at least one other layer in common.

In accordance with another aspect of the present disclosure, a method of forming a crosslinked emissive layer of a light-emitting device in which quantum dots are dispersed includes the steps of: depositing a mixture on a deposition surface, the mixture including: a solvent; cross-linkable material; and quantum dots and ligands respectively bonded to the quantum dots; and subjecting at least a portion of the mixture to an activation stimulus to crosslink the cross-linkable material; wherein during at least one of the depositing and subjecting steps, the quantum dots are distributed unevenly within the crosslinked charge transport material and arranged relative to the deposition layer; and wherein the ligands have a concentration relative to the weight of the quantum dots in a range of 10 to 40 wt %.

In some embodiments, the ligands have a concentration relative to the weight of the quantum dots in a range of 15 to 35 wt %.

In some embodiments, the mixture further includes a photo initiator and the activation stimulus includes exposure to UV light.

In some embodiments, the light-emitting device includes a first electrode on which the crosslinked emissive layer is formed, and the method further includes forming a second electrode on top of the crosslinked emissive layer.

To the accomplishment of the foregoing and related ends, the invention, then, includes the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

FIGS. 4A, 4B, 4C, 4D, 4E, 4F, and 4G are drawings depicting cross-sections of an exemplary CCTEL 307 from FIG. 3 in accordance with embodiments of the present application.

FIGS. 5A-5E are drawings depicting polymerization of a mixture of a cross-linkable charge transporting material and QDs in an organic solvent to form a QD layer on an outer surface of the crosslinked material in accordance with embodiments of the present application.

FIGS. 6A-6E are drawings depicting polymerization of a mixture of a cross-linkable charge transporting material and QDs in an organic solvent to form a QD monolayer on an outer surface of the crosslinked material in accordance with embodiments of the present application.

FIGS. 7A-7E are drawings depicting polymerization of a mixture of a cross-linkable charge transporting material and QDs in an organic solvent to form a QD layer at a bottom outer surface of a crosslinked material in accordance with embodiments of the present application.

FIGS. 8A-8E are drawings depicting polymerization of a mixture of a cross-linkable charge transporting material and QDs in an organic solvent to form a QD monolayer at a bottom outer surface of a crosslinked material in accordance with embodiments of the present application.

FIGS. 9A-9E are drawings depicting polymerization of a mixture of a cross-linkable charge transporting material and QDs in an organic solvent to form a layer with QDs randomly distributed in a layer of a crosslinked material in accordance with embodiments of the present application.

FIGS. 11A, 11B, 11C, 11D1, 11D2, 11D3, 11E1, 11E2, 11E3, 11E4, 11E5 and 11E6 are drawings depicting a progression of steps constituting an exemplary method of fabricating a light-emitting device in accordance with embodiments of the present application.

DESCRIPTION OF EMBODIMENTS

Figure 1B:
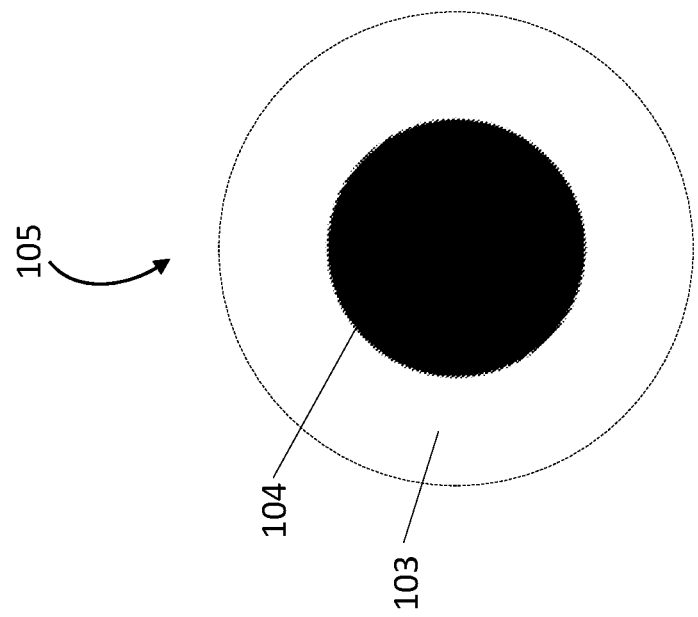
FIG. 1B depicts a schematic simplified version of FIG. 1A.

Embodiments of the present invention will now be described with reference to the drawings, wherein like reference numerals are used to refer to like elements throughout. It will be understood that the figures are not necessarily to scale.

Figure 1A:
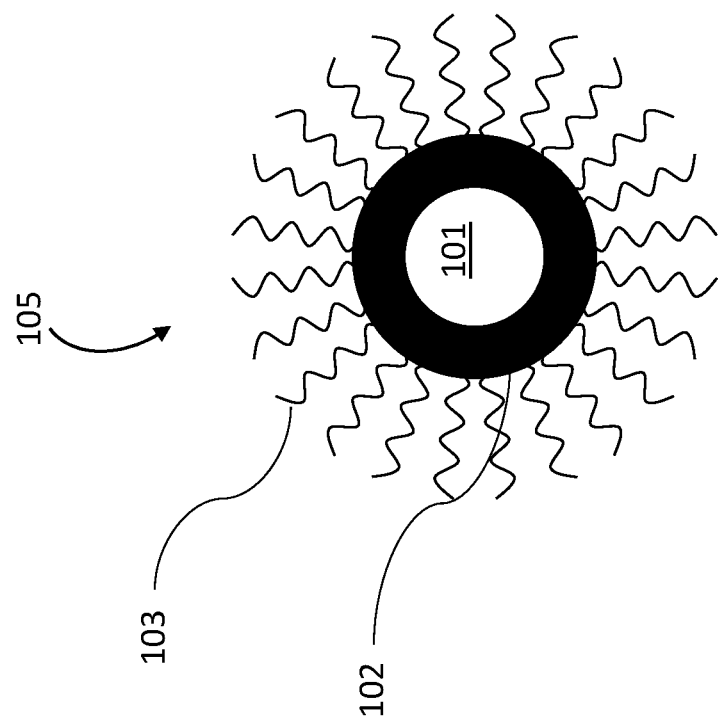
FIG. 1A depicts a two-dimensional schematic representation of a core-shell QD employed in an emissive layer.

FIG. 1A and FIG. 1B are drawings depicting a two-dimensional schematic representation of a core-shell QD 105. Multiple instances of the QD 105 may be employed in an emissive layer. The QDs may be configured as nanoparticles. FIG. 1A schematically shows that the QD may include a nanocrystalline core 101 that is co-crystallized with a shell 102 including a compatible material, which is then surrounded by ligands 103 (bonded/attached to the surface of the QD) that passivate crystal defects in the core-shell QD, i.e., core 101 and shell 102, and allow and improve solubility in common solvents. FIG. 1B is a schematic simplified version of FIG. 1A used for more convenient representation of QDs in a light-emitting device structure, depicting a generalized core-shell QD structure 104 surrounded by a region of ligands 103.

Exemplary QD core and shell materials include one or more of: InP, CdSe, CdS, $CdSe_xS_{1-x}$, CdTe, $Cd_xZn_{1-x}Se$, $Cd_xZn_{1-x}Se_yS_{1-y}$, ZnSe, ZnS, $ZnS_xTe_{1-x}$, $ZnSe_xTe_{1-x}$, perovskites of the form $ABX_3$, $Zn_wCu_zIn_{1-(w+z)}S$, and carbon, where $0 \le w$, $x$, $y$, $z \le 1$.

The surface of a nanocrystalline quantum dot plays an important role in dictating its properties. Considering, for example, a standard metal-chalcogenide core-shell QD, the surface has incomplete crystalline structure (and thus defects). These atoms cannot have the same crystalline structure of the inner atoms; being on the surface, they cannot be completely surrounded by other atoms as happens inside the crystal. The surface, depending on the QD structure, on the synthesis method, and the like, can be metal rich (electrophilic) of chalcogenide rich (nucleophilic). The surface, including the defects, can be passivated by bonding ligands.

Exemplary ligands 103 include alkyl, -alkenyl, -alkynyl or aryl (linear, branched or cyclic) thiols with 1 to 30 atoms of carbon; alkyl, -alkenyl, -alkynyl or aryl (linear, branched or cyclic) alcohols with 1 to 30 atoms of carbon; alkyl, -alkenyl, -alkynyl or aryl (linear, branched or cyclic) carboxylic acids with 1 to 30 atoms of carbon; tri-alkyl, -alkenyl, -alkynyl or aryl (linear, branched or cyclic) phosphine oxides with 1 to 60 atoms of carbon; alkyl, -alkenyl, -alkynyl or aryl (linear, branched or cyclic) amines with 1 to 30 atoms of carbon; salts formed from any of the above listed compounds (the anion or the cation are the binding moieties); halogen salts (the anion or the cation are the binding moieties). It will be appreciated that while the present disclosure primarily describes the QDs as core-shell QDs, in some embodiments the QDs may not be of the core-shell type or they may be of a core/multiple-shells type having more than one shell. The non-core-shell type QDs may be made from one or more of the above-mentioned materials, and the QDs in accordance with the present disclosure may not include a core-shell configuration.

Each of the ligands 103 and the QDs 104 (e.g., the core-shell or non-core-shell type) may contain electrophilic centers and/or nucleophilic centers. An electrophilic or nucleophilic center is the atom or chemical group that is intrinsically able to accept or donate a pair of electrons. This may allow the ligands and QDs to form bonds between each other. As an example, a core-shell nanocrystalline QD with a metal rich surface (electrophilic) can bond ligands with a nucleophilic center (e.g. oleic acid).

A ligand is an electrophilic species (electrophile) or nucleophilic species (nucleophile) that contains an electrophilic or nucleophilic center.

In some embodiments, the ligands of the QDs have a chemical structure that can compete in the polymerization of a UV cross-linkable charge transporting material monomer. For example, if the polymerization of the UV cross-linkable charge transporting material follows an anionic pathway, ligands with active electrophilic centers (or with an active center with adjacent substituent(s) that can stabilize a negative charge) can compete with the monomers and then terminate the main polymerization reaction. An electrophile is a chemical species that accepts an electron pair. It participates in a chemical reaction by accepting an electron pair in order to bond to a nucleophile. Electrophiles are positively charged or neutral species having vacant orbitals that are attracted to an electron rich center. In organic chemistry, usually an electrophilic atom is a carbon which is bonded to an electronegative atom, usually oxygen, nitrogen, sulfur, or a halogen.

Major factors that affect electrophile strength or "electrophilicity" include one or more of steric effects, electron donating groups, and electron withdrawing groups. Steric effects include bulky species that are less electrophilic than analogous small species during SN2 reactions. In SN1 reactions electrophilicity depends on how easy it is to make a carbocation and how stable it is. Electron donating groups (EDG) stabilize a carbocation. Alkyl groups are weak EDG; stabilization has this order: tertiary >secondary >primary >methyl. EDG with resonance effect stabilize aromatic or conjugated carbocations. Heteroatoms of heterocyclic are electron withdrawing groups (EWG) with inductive effect, but they behave as EDG with resonance effect; depending on where the carbocation is in the cycle, it can be stabilized by resonance effect or destabilized by inductive effect. EWGs with only inductive effect destabilize a carbocation (e.g., carbonyls are EWGs with inductive effect and, if they are in alpha to the carbocation, they highly destabilize it).

Exemplary electrophilic centers include: cations such as $H^+$ and $NO^+$, polarized neutral molecules such as HCl, alkyl halides, acyl halides, and carbonyl compounds, polarizable neutral molecules such as $Cl_2$ and $Br_2$, oxidizing agents such as organic peracids, chemical species that do not satisfy the octet rule such as carbenes and radicals, and some Lewis acids such as $BH_3$ and DIBAL; and the like.

Alternatively, if the polymerization of the UV cross-linkable charge transporting material follows a cationic pathway, ligands with active nucleophilic centers (or with an active center with adjacent substituent(s) that can stabilize a positive charge) can compete with the monomers and then terminate the main polymerization reaction. A nucleophile is a chemical species that donates an electron pair to form a chemical bond in relation to a reaction. All molecules or ions with a free pair of electrons or at least one double bond can act as nucleophiles.

Major factors that affect nucleophile strength or "nucleophilicity" are charge, periodic table trends, resonance effect, steric effects, and the like. For instance, negatively charged species are usually more nucleophilic than corresponding neutral species. To illustrate the effect of charge, a hydroxide ion is much more nucleophilic (and basic) than a water molecule because the negatively charged oxygen on the hydroxide ion carries greater electron density than the oxygen atom of a neutral water molecule.

Periodic table trends also affect nucleophile strength. For example, moving horizontally, from the right to the left across the second row of the periodic table, the nucleophilicity increases ($R_3C^->R_2N^->RO^->F^-$; with R=hydrocarbon group). In protic solvents (e.g., water, methanol), moving vertically from the bottom to the top across the periodic table, the nucleophilicity decreases (more basic species are more solvated with solvent and less efficient as nucleophile). In polar aprotic solvents (e.g. acetone, DMF, acetonitrile), moving vertically from the bottom to the top across the periodic table, the nucleophilicity increases (nucleophilicity has same trend of basicity). In apolar solvents nucleophiles are not usually soluble in these solvents.

Resonance effects also affect nucleophile strength. For example, if the electron lone pair on a heteroatom is delocalized by resonance, it is inherently less reactive—meaning less nucleophilic, and also less basic (e.g., the nitrogen atom on an amide is less nucleophilic than the nitrogen of an amine, due to the resonance stabilization of the nitrogen lone pair provided by the amide carbonyl group).

Steric effects also affect nucleophile strength. For example, bulky species are less nucleophilic than analogous small species (tert-butanol is less nucleophilic than methanol because the comparatively bulky methyl groups on the tertiary alcohol effectively block the route of attack by the nucleophilic oxygen, slowing its efficacy considerably).

Exemplary nucleophilic centers include: carboxylic acids, thiols, alcohols, amines, amides, esters, ethers, epoxides, enols, thiocyanites, isothiocyanites, thiolcarboxylic acids, dithiocarbonates, dithiocarbamates, oxetanes, diazonium salts, alkynes, alkenes, halogen salts, azides, nitrites, carbazides, conjugated bases of these, and the like.

Common ligands 103 have both nucleophilic and electrophilic centers. Electrophilic centers may be in the alpha position relative to the nucleophilic center. In exemplary embodiments, a nucleophilic center may be stronger than an electrophilic center considering the points discussed above. Common ligands 103 of QDs 104 (e.g. amines, phosphine oxides, thiols) usually behave in this way. For example, a carboxylic acid can be nucleophilic. However, the carbon in the alpha position to the carbonyl oxygen has electrophilic character with a partial positive charge. Nevertheless, the nucleophilic character is much more accentuated because the carbocation that can be originated from this carbon will be highly destabilized from the adjacent carbonyl group.

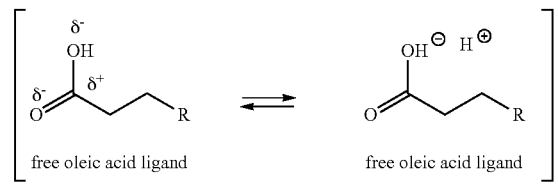

In an exemplary embodiment, carboxylic acid ligands of the QDs 104 present in concentrations higher than the ideal can cause the termination of a cationic ring-opening polymerisation of oxetanes groups of the cross-linkable material. As shown below, the carboxylic acid can compete with a new oxetane monomer for the attack to the activated oxetane cation, leading to a termination of the polymerization, thus the final polymers will have low average molecular weight.

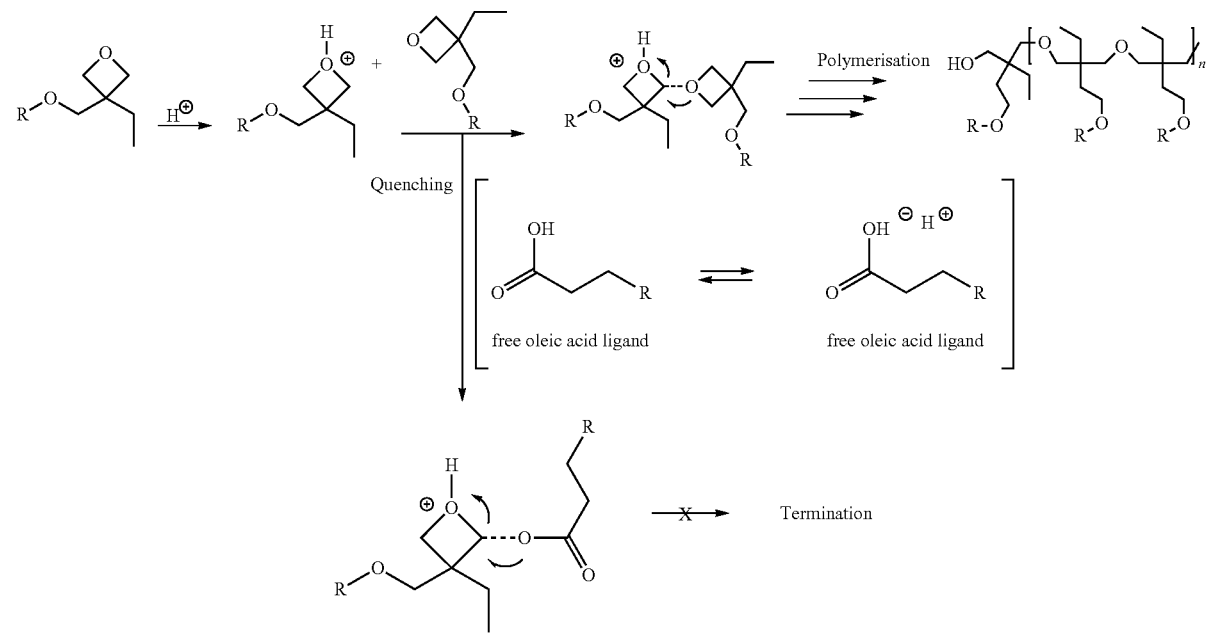

The cross-linked material may be originated from the polymerization of a cross-linkable organic (or organo-metallic) material. One example of a cross-linkable material from which the structure described above may be formed is N4,N4'-Bis(4-(6-((3-ethyloxetan-3-yl)methoxy)hexyl)phenyl)-N4,N4'-diphenylbiphenyl-4,4'-diamine (OTPD), shown below in Formula 1. In some embodiments, the cross-linkable material shown in Formula 1 may be used in forming the matrix shown in the figures.

Formula 1

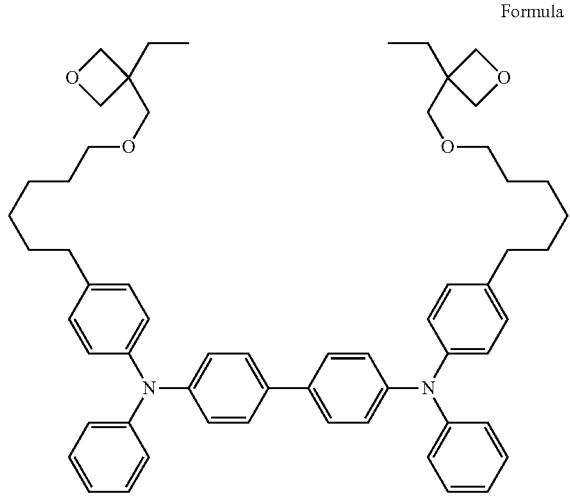 [SMILES: CCC1(COCCCCCCc2ccc(N(c3ccccc3)c3ccc(-c4ccc(N(c5ccccc5)c5ccc(CCCCCCOCC6(CC)COC6)cc5)cc4)cc3)cc2)COC1]

Another example of a cross-linkable material from which the structure described above may be formed is N4,N4'-Bis(4-(6-((3-ethyloxetan-3-yl)methoxy)hexyloxy)phenyl)-N4,N4'-bis(4-methoxyphenyl)biphenyl-4,4'-diamine (QUPD), shown below in Formula 2. In some embodiments, the cross-linkable material shown in Formula 2 may be used in forming the matrix shown in the figures.

Formula 2

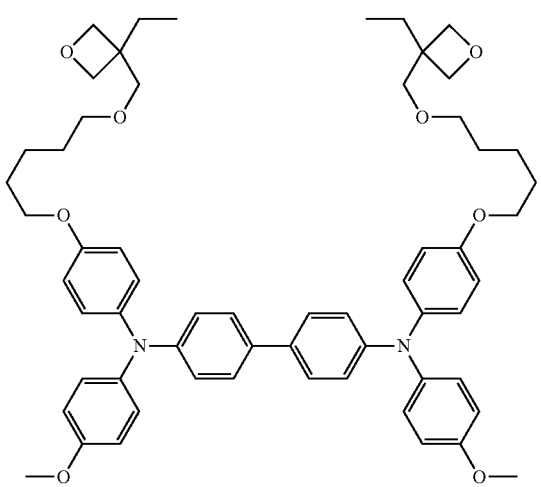

Another example of a cross-linkable material from which the structure described above may be formed is N,N'-(4,4'-(Cyclohexane-1,1-diyl)bis(4,1-phenylene))bis(N-(4-(6-(2-ethyloxetan-2-yloxy)hexyl)phenyl)-3,4,5-trifluoroaniline) (X-F6-TAPC), shown below in Formula 3. In some embodiments, the cross-linkable material shown in Formula 3 may be used in forming the matrix shown in the figures.

Formula 3

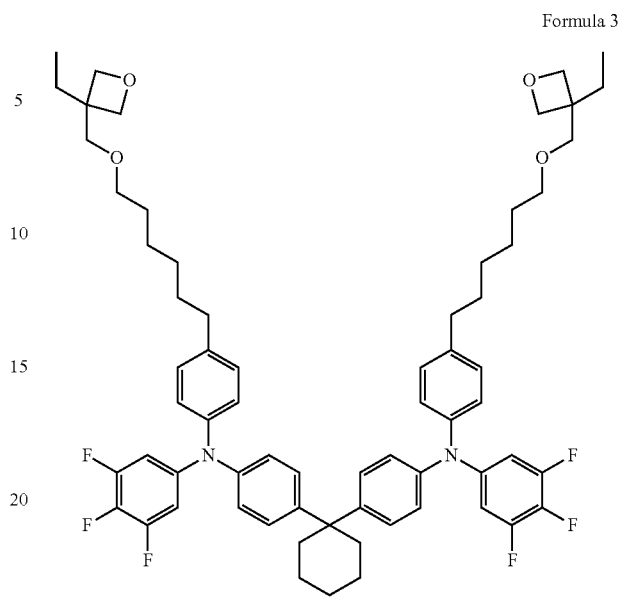

An example of a cross-linkable material from which the structure described above may be formed is N4,N4'-Di(naphthalen-1-yl)-N4,N4'-bis(4-vinylphenyl)biphenyl-4,4'-diamine (VNPB), shown below in Formula 4. In some embodiments, the cross-linkable material shown in Formula 4 may be used in forming the matrix shown in the figures.

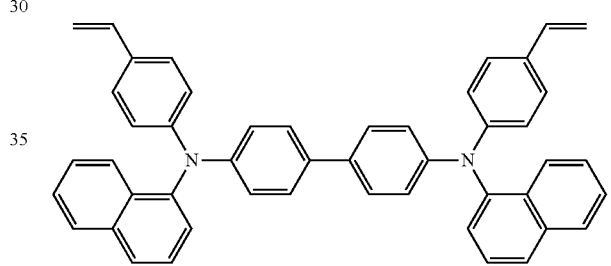

Another example of a cross-linkable material from which the structure described above may be formed is 9,9-Bis[4-[(4-ethenylphenyl)methoxy]phenyl]-N2,N7-di-1-naphthalenyl-N2,N7-diphenyl-9H-Fluorene-2,7-diamine (VB-FNPD), shown below in Formula 5. In some embodiments, the cross-linkable material shown in Formula 5 may be used in forming the matrix shown in the figures.

Formula 5

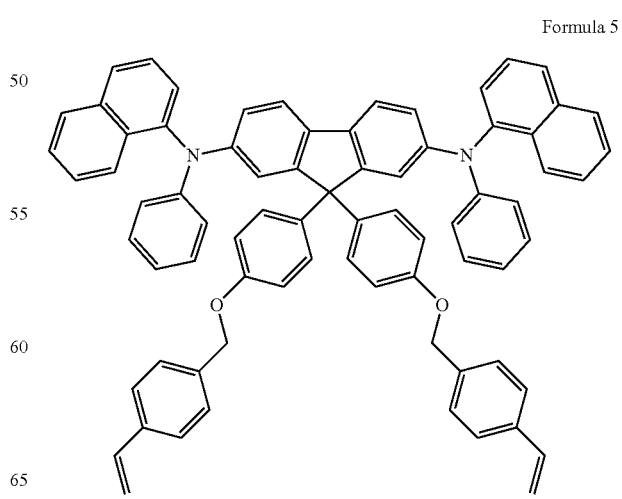

Another example of a cross-linkable material from which the structure described above may be formed is 3,5-di-9H-carbazol-9-yl-N,N-bis[4-[[6-[(3-ethyl-3-oxetanyl)methoxy]hexyl]oxy]phenyl]-benzenamine (Oxe-DCDPA), shown below in Formula 6. In some embodiments, the cross-linkable material shown in Formula 6 may be used in forming the matrix shown in the figures.

Formula 6

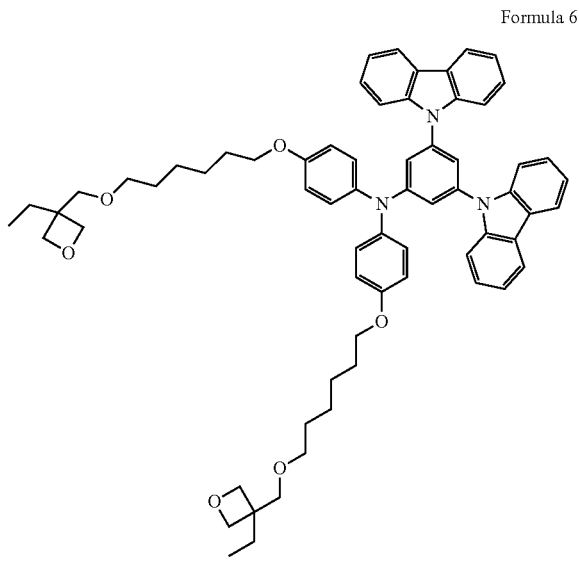 [SMILES: CCC1(COCCCCCCOc2ccc(N(c3ccc(OCCCCCCOCC4(CC)COC4)cc3)c3cc(-n4c5ccccc5c5ccccc54)cc(-n4c5ccccc5c5ccccc54)c3)cc2)COC1]

In some embodiments the emissive layer is formed using one or more photo-initiators in addition to the one or more types of cross-linkable materials and the one or more types of QDs. As such, the layer described in this application may include one or more photo-initiators. A photo initiator is a material that initiates polymerization in response to light stimuli. In some embodiments, the photo initiator may generate one or more radicals, ions, acids, and/or species that may initiate such polymerization. Photo initiators include sulfonium- and iodonium-salts (e.g., triphenylsulfonium triflate, diphenyliodonium triflate, iodonium, [4-(octyloxy)phenyl]phenyl hexafluorophosphate, bis(4-methylphenyl)iodonium hexafluorophosphate, diphenyliodonium hexafluoroarsenate, diphenyliodonium hexafluoroantimonate, etc.), chromophores containing the benzoyl group (benzoin ether derivatives, halogenated ketones, dialkoxyacetophenones, diphenylacetophenones, etc.), hydroxy alkyl heterocyclic or conjugated ketones, benzophenone- and thioxanthone-moiety-based cleavable systems (such as benzophenone phenyl sulfides, ketosulfoxides, etc.), benzoyl phosphine oxide derivatives, phosphine oxide derivatives, trichloromethyl triazines, biradical-generating ketones, peroxides, diketones, azides and aromatic bis-azides, azo derivatives, disulfide derivatives, disilane derivatives, diselenide and diphenylditelluride derivatives, digermane and distannane derivatives, peresters, Barton's ester derivatives, hydroxamic and thiohydroxamic acids and esters, organoborates, titanocenes, chromium complexes, aluminate complexes, tempo-based alkoxyamines, oxyamines, alkoxyamines, and silyloxyamines.

The solvent used may be any suitable solvent. For example, the solvent may be selected such that the QDs, the cross-linkable material, and a photo initiator are soluble therein. Exemplary solvents include, but are not limited to, one or more of the following: acetone, dichloromethane, chloroform, linear or branched alkyl acetates (e.g., ethyl acetate, n-butyl acetate, 2-butyl acetate), linear or branched alkanes with 3 to 30 atoms of carbon (e.g., pentane, hexane, heptane, octane, nonane, decane, undecane, dodecane), linear or branched alcohols with 1 to 20 atoms of carbon (e.g., butanol, 2-propanol, propanol, ethanol, methanol), linear or branched alkoxy alcohols with 2 to 20 atoms of carbon (e.g., 2-Methoxyethanol, 2-Ethoxyethanol), mono, di and tri halogen substituted benzenes (e.g., chlorobenzene, 1,2-dibromobenzene, 1,3-dibromobenzene, 1,4-dibromobenzene, 1,3,5-tribromobenzene, 1,2,4-tribromobenzene), linear or branched ethers with 2 to 20 atoms of carbon, and/or mono, di and tri alkyl substituted benzenes (e.g., toluene, 1,2-Dimethylbenzene, 1,3-Dimethylbenzene, 1,4-Dimethylbenzene), benzene, dioxane, propylene glycol monomethyl ether acetate (PGMEA), 1-methoxy-2-propanol. The solvent that is utilized may depend on the specific quantum dots, cross-linkable material, and photo initiator that are selected. QDs, ligands of the QDs, and cross-linkable material can be selected to create uniform dispersion in the deposition solvent. Materials with similar polarity indices can be selected to ensure homogeneity of the deposited mixtures.

Figure 2:
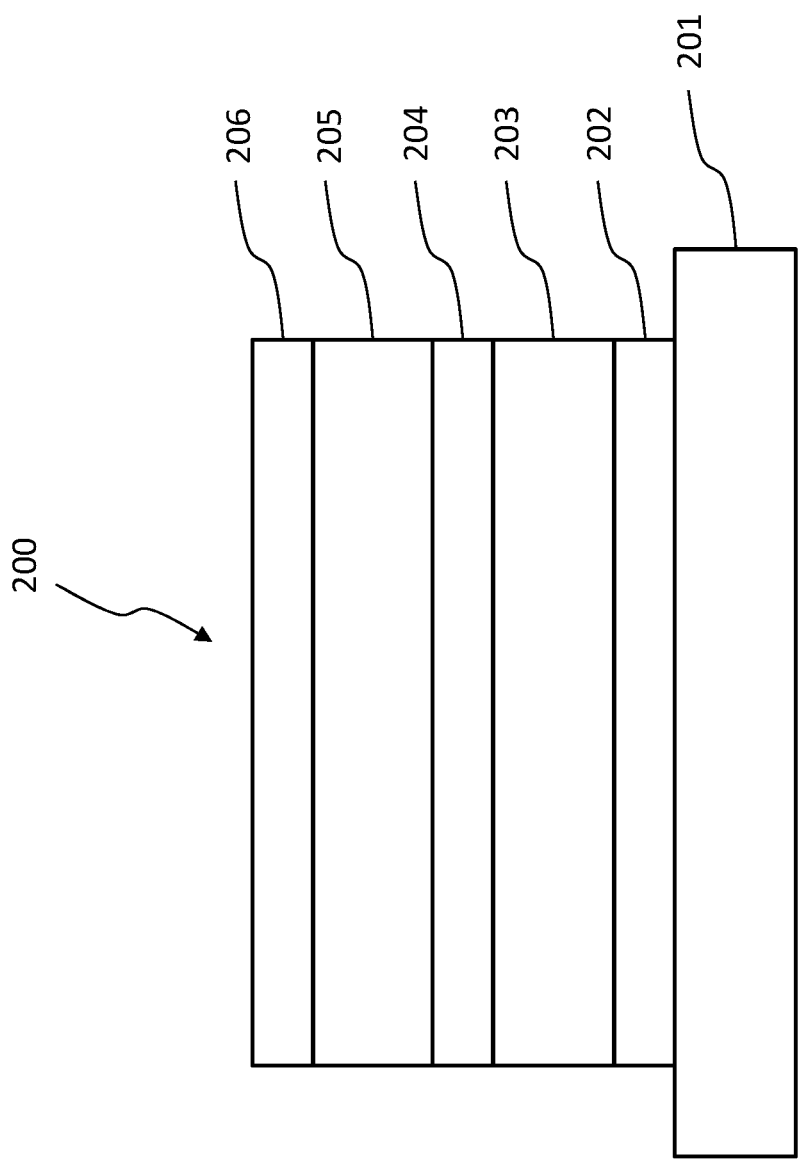
FIG. 2 is a drawing depicting a cross-section of a configuration of a conventional QD-LED structure.

FIG. 2 is a drawing depicting a cross-section of a configuration of a conventional QD-LED 200 structure. Several planar layers are disposed on a substrate 201, including: a first electrode 202; a second electrode 206; an emissive layer (EML) 204 disposed between the first electrode 202 and the second electrode 206; one or more first charge transport layers (CTL) 203 disposed between the first electrode 202 and the emissive layer 204; and one or more second charge transport layers 205 disposed between the second electrode 206 and the emissive layer 204. In some embodiments, the QD-LED structure may have a structure wherein the first electrode 202 is an anode, the one or more first charge transport layers 203 are hole transport layers (HTLs), the one or more second transport layers 205 are electron transport layers (ETLs), and the second electrode 206 is a cathode. This structure may also be referred to as a "standard structure." In other embodiments, the QD-LED structure may have an "inverted structure" wherein the first electrode 202 is a cathode, the one or more first charge transport layers 203 are ETLs, the one or more second transport layers 205 are HTLs, and the second electrode 206 is an anode. During operation, a bias is applied between the anode and the cathode. The cathode injects electrons into the adjacent CTL, and likewise the anode injects holes into the adjacent CTL. The electrons and holes propagate through the CTLs to the EML, where they radiatively recombine and light is emitted. A QD-LED may be described as "bottom-emitting" if light is primarily emitted out of the substrate 201 side, and a QD-LED may be described as "top-emitting" if light is primarily emitted out of the second electrode 206 side opposite from the substrate 201.

Figure 3:
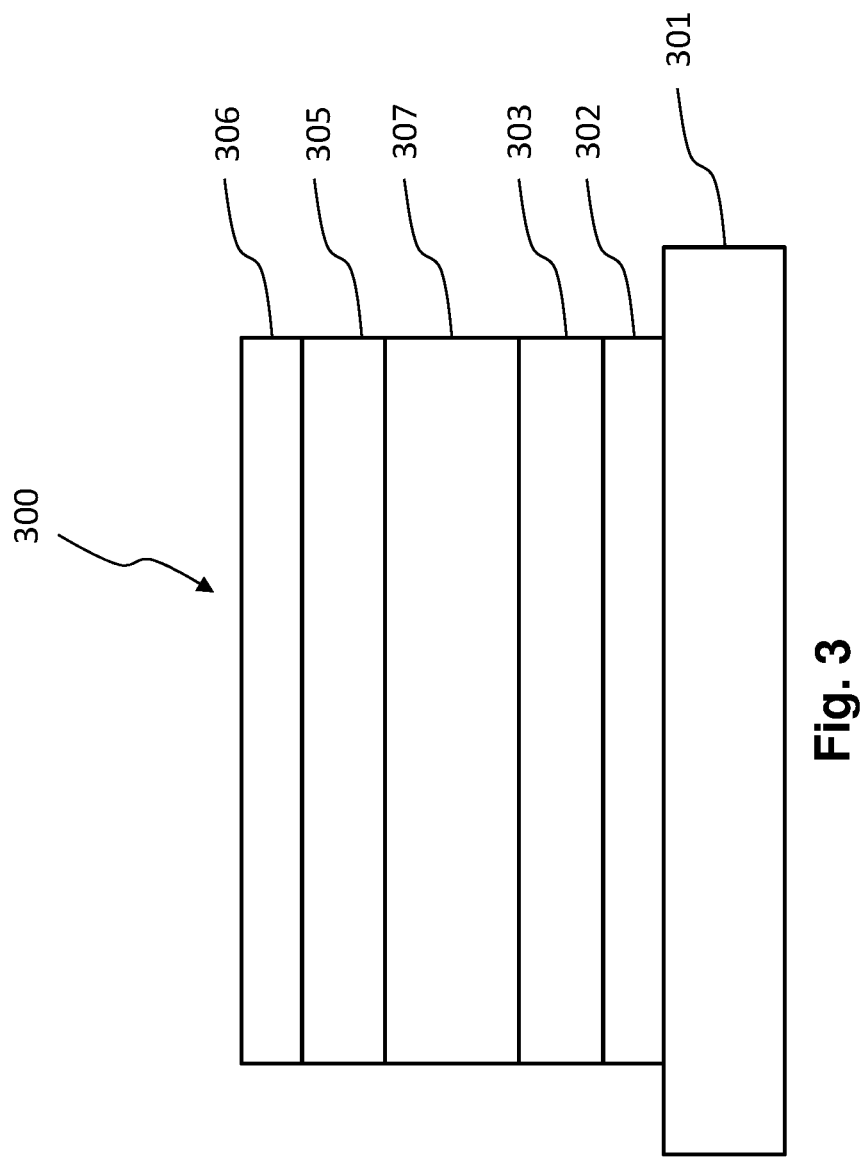
FIG. 3 is a drawing depicting a cross-section of a QD-LED structure in accordance with embodiments of the present application.

FIG. 3 is a drawing depicting a cross-section of a QD-LED structure 300 in accordance with embodiments of the present application. The light emitting device 300 includes a substrate 301, a first electrode 302, an optional one or more first charge transport layers 303, an optional one or more second charge transport layers 305, and a second electrode 306. Such layers may be configured and composed comparably as analogous layers of the conventional configuration of FIG. 2. In embodiments of the present application, in contrast to the conventional configuration, the light-emitting device 300 includes a combined charge transport and emissive layer (CCTEL) 307, which as further detailed below combines properties of a charge transport layer and an emissive layer.

The substrate 301 may be made from any suitable material(s) as are typically used in light-emitting devices, such as glass substrates and polymer substrates. More specific examples of substrate materials include polyimides, polyethenes, polyethylenes, polyesters, polycarbonates, polyethersulfones, polypropylenes, and/or polyether ether ketones. The substrate 301 may be any suitable shape and size. In exemplary embodiments, the dimensions of the substrate allow for more than one light-emitting device to be provided thereon. For example, a major surface of the substrate may provide an area for multiple light-emitting devices to be formed as sub-pixels of a pixel, with each sub-pixel emitting light of a different wavelength such as red, green, and blue. In another example, a major surface of the substrate may provide an area for multiple pixels to be formed thereon, each pixel including a sub-pixel arrangement of multiple light-emitting devices.

The electrodes 302 and 306 may be made from any suitable material(s) as are typically used in light-emitting devices. At least one of the electrodes is a transparent or semi-transparent electrode for light emission, and the other of the electrodes is a reflective electrode to reflect any internal light toward the light-emitting side of the device. In the case of a bottom-emitting device, the first electrode 302 will be transparent or semi-transparent. Typical materials for the transparent or semi-transparent electrode include indium-doped tin oxide (ITO), fluorine doped tin oxide (FTO) or indium-doped zinc oxide (IZO), aluminum-doped zinc-oxide (AZO), indium-doped cadmium-oxide, and the like. In the case of a top-emitting device, the first electrode 302 may be made of any suitable reflective metal such as silver. In bottom-emitting devices, the second electrode 306 is a reflective electrode. Typical materials used for the reflective electrode include metals such as aluminum or silver (cathodes for a conventional structure) and gold or platinum (anodes for an inverted structure). Top-emitting structures will use a semi-transparent second electrode 306 such as thin (e.g., less than 20 nm thick) silver, a metallic bilayer (e.g., 2 nm Aluminum and 15 nm Silver), a silver nanowires layer or a magnesium-silver alloy. The electrodes 302, 306 may also be provided in any suitable arrangement. As an example, the electrodes 302, 306 may address a thin-film transistor (TFT) circuit.

The optional one or more first charge transport layers 303 and optional one or more second charge transport layers 305 may be made from any suitable material(s). In exemplary embodiments, the electron transport and/or electron injection layers may include individual or combinations of: ZnO, 8-quinolinolato lithium (Liq.), LiF, $Cs_2CO_3$, $Mg_xZn_{1-x}O$, $Al_xZn_{1-x}O$, $Ga_xZn_{1-x}O$, 2,2',2''-(1,3,5-benzinetriyl)-tris(1-phenyl-1-H-benzimidazole) (TPBi), $TiO_2$, $ZrO_2$, N4,N4'-Di(naphthalen-1-yl)-N4,N4'-bis(4-vinylphenyl)biphenyl-4,4'-diamine (VNPB), 9,9-Bis[4-[(4-ethenylphenyl)methoxy]phenyl]-N2,N7-di-1-naphthalenyl-N2,N7-diphenyl-9H-Fluorene-2,7-diamine (VB-FNPD), where $0 \leq x \leq 1$. The EML may include: QD nanoparticles which include one or more of: InP, CdSe, CdS, $CdSe_xS_{1-x}$, CdTe, $Cd_xZn_{1-x}Se$, $Cd_xZn_{1-x}Se_yS_{1-y}$, ZnSe, ZnS, ZnSTe, ZnSeTe, perovskites of the form $ABX_3$, $Zn_wCu_zIn_{1-(w+z)}S$, carbon, where $0 \leq w, x, y, z \leq 1$ and $(w+z) \leq 1$. In exemplary embodiments, the hole transport and/or hole injection layers may include individual or combinations of: poly(3,4-ethylenedioxythiophene): poly(styrenesulfonate) (PEDOT:PSS), poly(9,9-dioctylfluorene-co-N-(4-sec-butylphenyl)-diphenylamine) (TFB), poly(9-vinylcarbazole) (PVK), poly(N,N'-bis(4-butylphenyl)-N,N'-bisphenylbenzidine) (PolyTPD), $V_2O_5$, NiO, CuO, $WO_3$, $MoO_3$, 2,3,5,6-tetrafluoro-7,7,8,8-tetracyanoquinodimethane (F4TCNQ), 1,4,5,8,9,11-hexaazatriphenylenehexacarbonitrile (HATCN), N4,N4'-Bis(4-(6-((3-ethyloxetan-3-yl)methoxy)hexyl)phenyl)-N4,N4'-diphenylbiphenyl-4,4'-diamine (OTPD), N4,N4'-Bis(4-(6-((3-ethyloxetan-3-yl)methoxy)hexyloxy)phenyl)-N4,N4'-bis(4-methoxyphenyl)biphenyl-4,4'-diamine (QUPD), N,N'-(4,4'-(Cyclohexane-1,1-diyl)bis(4,1-phenylene))bis(N-(4-(6-(2-ethyloxetan-2-yloxy)hexyl)phenyl)-3,4,5-trifluoroaniline) (X-F6-TAPC), 3,5-di-9H-carbazol-9-yl-N,N-bis[4-[[6-[(3-ethyl-3-oxetanyl)methoxy]hexyl]oxy]phenyl]-benzenamine (Oxe-DCDPA).

The EML 204 may be a cross-linked layer in which QDs are dispersed (CLQDL). In exemplary embodiments, the light-emitting device includes an anode, a cathode, and a CLQDL disposed between the anode and the cathode, the CLQDL including a crosslinked material and quantum dots. In some embodiments, the quantum dots are dispersed in, but do not form a part of, the cross-linked network of the cross-linked layer. In other embodiments, the quantum dots are dispersed in, and form a part of, the cross-linked network of the cross-linked layer. In exemplary embodiments, the cross-linkable material used in the formation of the CLQDL can be a charge transporting material. A CLQDL with a charge transporting material can be a combined charge transporting and emissive layer (CCTEL). The CCTEL may be formed from a solution that includes one or more types of QDs, one or more types of cross-linkable material, and one or more solvents. It will be appreciated that while reference may be made in the disclosure to one of a CLQDL or CCTEL, the disclosure associated with such reference may equally apply to the non-referenced term.

In various embodiments, the quantum dots are distributed unevenly within the crosslinked material. As described herein, an uneven distribution refers to a state in which the QDs are not uniformly distributed throughout the layer, such that a concentration of QDs in a given area or volume of the layer is different from one or more other areas or volumes of the layer.

For example, the quantum dots may be segregated within the crosslinked material whereby the quantum dots are predominantly or completely located in a half portion of the CCTEL closest to the cathode (e.g., upper half or lower half of the CCTEL, depending on the structure of the device), and may form a layer, monolayer, clusters, or other groupings of quantum dots in the half portion of the CCTEL closest to the cathode (e.g., at, proximate, and/or adjacent to an outer surface of the CLQDL closest to the cathode). As another example, the quantum dots may be segregated within the crosslinked material whereby the quantum dots are predominantly or completely located in a half portion of the CLQDL closest to the anode (e.g., upper half or lower half of the CCTEL, depending on the structure of the device), and may form a layer, monolayer, clusters, or other groupings of quantum dots in the half portion of the CCTEL closest to the anode (e.g., at, proximate, and/or adjacent to an outer surface of the CLQDL closest to the anode).

In some embodiments, at least 75% of the quantum dots are located in a half portion of the CCTEL closest to the deposition surface on which the CCTEL is formed (e.g., closest to the electrode 302). In other embodiments, at least 85% of the quantum dots are located in a half portion of the CCTEL closest to the deposition surface on which the CCTEL is formed (e.g., closest to the electrode 302). In other embodiments, at least 95% of the quantum dots are located in a half portion of the CCTEL closest to the deposition surface on which the CCTEL is formed (e.g., closest to the electrode 302). In some embodiments, at least 75% of the quantum dots are located in a half portion of the CCTEL distal to the deposition surface on which the CCTEL is formed (e.g., closest to the electrode 306). In other embodiments, at least 85% of the quantum dots are located in a half portion of the CCTEL distal to the deposition surface on which the CCTEL is formed (e.g., closest to the electrode 306). In other embodiments, at least 95% of the quantum dots are located in a half portion of the CCTEL distal to the deposition surface on which the CCTEL is formed (e.g., closest to the electrode 306).

In another example, the quantum dots may be segregated within the crosslinked charge transport material whereby the quantum dots are present in distinct pairs and/or clusters randomly distributed within the CCTEL. In some embodiments, at least 75% of the quantum dots are provided in pairs and/or clusters. In other embodiments, at least 85% of the quantum dots are provided in pairs and/or clusters. In other embodiments, at least 95% of the quantum dots are provided in pairs and/or clusters.

The quantum dots may be segregated within the cross-linked material at least in part during the deposition process as the solvent in the mixture containing the quantum dots and the cross-linkable material evaporates. Additionally or alternatively, the quantum dots may be segregated within the crosslinked material at least in part in response to the activation stimulus, such as in response to exposure to UV light. Accordingly, the precise timing and nature of the segregation may vary among embodiments. The term segregated, as used herein, is a state in which the QDs and the crosslinked (or cross-linkable) material is separated into two distinct phases. It will be understood that the QDs are not soluble in the cross-linkable material, and that segregated as used herein is distinguished from the state in which the QDs are homogeneously (or near homogeneously) dispersed in the CCTEL. A given phase may be contiguous, or may be two or more separate parts dispersed in the other phase.

The CCTEL 307 may be a CLQDL including a charge transport material and emissive quantum dots in which holes and electrons recombine to emit light. The charge transport material may be chemically cross-linked. In some embodiments, the quantum dots are dispersed in, but do not form a part of, the cross-linked network of the cross-linked layer. In other embodiments, the quantum dots are dispersed in, and form a part of, the cross-linked network of the cross-linked layer. In exemplary embodiments, the quantum dots are distributed unevenly throughout the charge transport material of the CCTEL 307. Such distribution may be that which is described above with respect to the CLQDL.

Exemplary embodiments of the present application use a polymerizable organic host material with specific features including at least one polymerizable functional group and at least one charge transporting moiety. In some embodiments a photoinitiator (or initiator in general) is included. The QDs 104 can phase segregate in one of opposing portions of the CCTEL, or in intermediate positions. The polymerization of the CCTEL makes the layer solvent resistant, and there may be specific interactions between the charge transport material and the QDs that render the structure particularly advantageous as compared to conventional configurations. Packing of the QDs can be directed or guided by polymerization such that a specific morphology or structure can be achieved. The QDs occupy specific positions in the CCTEL in that alternative positions are blocked because the charge transport material links the QDs. Deposition of an additional layer on top makes the QDs less susceptible to relocation within the layer or partial rinsing from the solvent being used. Accordingly, more solvent compositions can be used to deposit layers on top of the CCTEL, so long as a solvent is orthogonal to the CCTEL that is crosslinked, and thus more resistant to solvent rinsing, rather than being orthogonal only to the QDs and easier to wash away.

During the polymerization process the QDs' ligands can be replaced or partially replaced with charge transport material, or the charge transport material can act as a co-ligand to improve defect passivation of QDs.

The QDs in the CCTEL are partially covered by the charge transport material, and this can have various advantages. For example, in a conventional QLED, electron mobility is higher than hole mobility due to the intrinsic properties of the materials used. In embodiments where the CCTEL includes hole transporting material and QDs, the hole transport from the cross-linked hole transporting material directly into the QDs may be improved due to the close interpenetrating structure of the CCTEL where QDs are surrounded by cross-linked hole transporting material. This may improve the balance of the charges reaching the QDs.

Embodiments of the present application may provide one or more unexpected advantages over conventional configurations. For example, the crosslinked material and QDs may be deeply interconnected and linked between each other, resulting in improved charge transport from the charge transport material into a quantum dot.

FIGS. 4A, 4B, 4C, 4D, 4E, 4F, and 4G are drawings depicting cross-sections of exemplary CCTELs 307 from FIG. 3 in accordance with embodiments of the present application. FIGS. 4A, 4B, 4C, 4D, 4E, 4F, and 4G illustrate exemplary embodiments of uneven quantum dot distribution within the CCTEL. The CCTEL 307 may be deposited on an underlayer 403 as shown in FIGS. 4A, 4B, 4C, 4D, 4E, 4F, and 4G. The underlayer 403 may be a substrate, an electrode, or a CTL. In each of FIGS. 4A, 4B, 4C, 4D, 4E, 4F, and 4G, quantum dots 401 are disposed within a cross-linked charge transport material 402. As referenced above, the quantum dot distribution within the cross-linked charge transport material is uneven, which may provide enhanced light-emitting efficiency in certain applications. The distribution of the quantum dots 401 within the cross-linked charge transport material 402 may be varied as follows as may be suitable for the requirements of any particular application. The distribution of the quantum dots in the CCTEL 307 may be obtained by segregation during a process to deposit and form the CCTEL 307 layer.

FIG. 4A illustrates an exemplary CCTEL 307 in which the quantum dots 401 are distributed randomly and surrounded by the cross-linked charge transport material 402. In some embodiments they may form clusters 404 of three or more QDs. In some embodiments, the random dispersion may also include individual and/or pairs of QDs dispersed within the cross-linked charge transport material 402.

FIG. 4B illustrates an exemplary CCTEL 307 in which the quantum dots 401 are distributed predominately in the upper half portion 405 of the CCTEL 307, i.e., in the half of the CCTEL layer thickness that is distal the underlayer 403. As shown, the distribution may include clusters of three or more QDs. In some embodiments, the distribution may also include individual and/or pairs of QDs. The clusters, pairs, and/or individual QDs may be arranged such that QDs are at or adjacent to at least a portion of the upper outer surface of the CCTEL layer distal the underlayer 403.

FIG. 4C illustrates an exemplary CCTEL 307 in which the quantum dots 401 are distributed at least partially within the CCTEL 307 primarily at or adjacent to the upper outer surface 406 of the CCTEL 307, i.e. the surface distal the underlayer 403.

The QDs may form a layer at the surface distal the underlayer 403. While the exemplary embodiment shown in FIG. 4C shows a layer of uniform thickness, in other embodiment, the thickness of the layer may vary over at least a portion of the layer.

In a variation shown in FIG. 4D, in an exemplary embodiment the quantum dots 401 may form a monolayer 407 (i.e., a single layer) located at least partially within the CCTEL 307 at or adjacent to said upper outer surface 406 of the CCTEL 307.

FIG. 4E illustrates an exemplary CCTEL 307 in which the quantum dots 401 are distributed predominately in the lower half portion 408 of the CCTEL 307, i.e. in the half of the CCTEL layer thickness that is closest to the underlayer 403. As shown, the distribution may include clusters of QDs. In some embodiments, the distribution may also include individual and/or pairs of QDs. The clusters, pairs, and/or individual QDs may be arranged such that QDs are at or adjacent to at least a portion of the lower outer surface of the CCTEL layer proximate the underlayer 403.

FIG. 4F illustrates an exemplary CCTEL 307 in which the quantum dots 401 are distributed at least partially within the CCTEL 307 primarily at or adjacent to the lower outer surface 409 of the CCTEL 307, i.e. the surface which forms an interface with the underlayer 403. The QDs may form a layer at the surface proximate the underlayer 403. While the exemplary embodiment shown in FIG. 4E shows a layer of uniform thickness, in other embodiment, the thickness of the layer may vary over at least a portion of the layer.

In a variation shown in FIG. 4G, in an exemplary embodiment the quantum dots 401 may form a monolayer 410 located at least partially within the CCTEL 307 at or adjacent to said lower outer surface 409 of the CCTEL 307.

In some embodiments, the arrangement of QDs in the CCTEL may be provided using one or a combination of arrangement approaches. In a first approach, the deposition surface on which the CCTEL is formed may be functionalized beforehand and QDs are directed to a specific position when the CCTEL is deposited. The QDs may be attracted to or repelled by the functionalized layer (e.g., which may be provided by the electrophilic or nucleophilic ligand centers). In a second approach, which may be used as an alternative or in addition to the first approach, the CCTEL is deposited on the deposition surface 502 that can be functionalized or not, and with an external stimulus, the QDs are directed to a specific position. Using proper combinations of attraction and/or repulsion forces (between the QDs and the deposition surface) the segregation of QDs can be directed in the desired direction. Exemplary methods of external stimulus includes UV (light) stimulus, electrochemical stimulus, pH stimulus, and temperature stimulus.

Referring again to the layered device structure depicted in FIG. 3 in combination with the CCTEL structures of FIGS. 4A-4G, an example of a light emitting device 300 is configured as a structure in which the first electrode 302 is the anode that injects holes, the second electrode 306 is the cathode and injects electrons, and the CCTEL 307 has hole transporting properties. Such a device including a CCTEL may be configured as follows: a substrate 301; a first electrode 302 which is an anode; an optional one or more first charge transport layers 303 which are hole transport layers; a CCTEL 307 in which the charge transport material is a hole transport material and the quantum dots are distributed as illustrated in one of FIGS. 4A-4G; one or more second charge transport layers 305 which are electron transport layers; and a second electrode 306 which is a cathode.

The one or more first charge transport layers 303 are optional because the charge transport material in the CCTEL has hole transporting properties in this example.

Polymerization of the cross-linkable molecules can occur by step-growth or chain-growth mechanism. In step-growth (or step) polymerization, each step may involve the combination of two polymer molecules of any lengths to form a longer polymer molecule. The average molar mass increases slowly and long chains are formed only late in the reaction. In chain-growth (or chain) polymerization, the only chain-extension reaction step is the addition of a monomer to a growing chain with an active center such as a free radical or ion. Once the growth of a chain is initiated by formation of an active center, chain propagation is usually rapid by addition of a sequence of monomers. Long chains are formed from the beginning of the reaction.

The polymerization can be less efficient (e.g. low average molecular mass) or stopped in the presence of external molecules that can act as quenchers. In other words, a quencher is a molecule that during a polymerization can compete with a monomer for the same active center, and stop the reaction allowing the formation of low average molecular mass polymers.

The emissive layer described in this application becomes resistant to solvent rinsing because the monomers are cross-linked to an extent that makes the cross-linked material insoluble in the solvent that originally dissolved the monomer (high average molecular mass). In the solution that originates the layer are QDs with their ligands and the monomer dissolved in a solvent. Exemplary embodiments may include an initiator. Ligand content of QDs is the content (concentration—usually measured as weight percent) of non-volatile organics present in a solution of QDs, exclusive of the cross-linkable material. QDs may have ligands attached to their surfaces; however, some of them can be free in solution depending on the ligand concentration and of the free surface area of the QDs not already occupied by a ligand (or hindered from other ligands). As the concentration of ligands increases, the concentration of free ligands increases. On one hand, if the concentration of the ligands is higher than an upper threshold amount, depending on their chemical structure and on their concentration, these free ligands can act as quenchers during the polymerization of cross-linkable materials in the solution of the cross-linkable material and QDs in a solvent. On the other hand, if the concentration of these ligands is lower than a lower threshold amount, defects on the surface of the QDs are not completely passivated, decreasing performance of QDs (e.g., quantum efficiency). This reflects the composition and the properties of the layers originated from these solutions. If the content of the ligands is higher than an upper threshold amount, free ligands can be found dispersed in the layer and the final morphology (and then properties) of the layer will not be ideal. The layer will not be a sufficiently cross-linked layer, decreasing the charge transporting and emitting properties of the layer. If the content of the ligand is lower than a lower threshold amount, the layer will be completely cross-linked but the QDs in the layer may not be completely passivated (unless the cross-linkable material acts as a substitute ligand) and therefore may be characterized by less than ideal emission properties of the layer.

As used herein, concentration of ligands in the QDs in solution is described as the weight percent of organics on the total weight of the solution after removal of any solvent and volatiles, exclusive of the cross-linkable material. Concentration of ligands in the QDs in a final film is described as the weight percent (wt %) of a specific ligand on the total solid mass of QDs plus the specific ligand, exclusive of the cross-linkable material. In most cases, these two concentrations coincide. Concentration may also be referred to as "content" or "amount". In some embodiments, the concentration of ligands in the QDs in solution is 10 to 45 wt % (in other embodiments, 15 to 35%).

Initial solutions used to deposit and form a CCTEL may include QDs (including ligands), cross-linkable charge transporting material, and solvent. In some embodiments, the range of concentrations of QDs in the cross-linkable material is 5 to 35 wt % (in other embodiments, 10 to 25 wt %). In some embodiments, the range of total (QDs+cross-linked material) concentrations in respect to the solvent is 0.1 to 10 wt % (in other embodiments, 2 to 3 wt %).

In an example, a solution used to deposit the CCTEL is composed by: 2.4 wt % cross-linkable material, 0.6 wt % QDs, and 97 wt % solvent. The 0.6 wt % QDs is composed by 0.15 wt % ligands and 0.45 wt % core-shell nanoparticles.

In some embodiments, the concentration of ligands either in the solution or in the final layer ranges from 10 to 45 wt %. In other embodiments, the concentration of ligands either in the solution or in the final layer ranges from 10 to 40%. In other embodiments, the concentration of ligands either in the solution or in the final layer ranges from 15 to 35%.

Examples and variations of forming a cross-linked layer dispersing quantum dots include the following. In an exemplary embodiment, a mixture of a UV cross-linkable charge transporting material and QDs is provided in an organic solvent. The mixture is deposited with a solution processable method on top of a substrate. A specific area, e.g., a sub-pixel, of the deposited layer is exposed to UV light. The cross-linkable material polymerizes, and the mixture becomes insoluble in the UV exposed area and the remaining materials are washed away with a solvent. FIGS. 5-9 depict various embodiments of a CCTEL with quantum dots containing ligands distributed unevenly within the cross-linked charge transport material. The uneven distribution may be characterized by QDs in the top half of the CCTEL (FIG. 5), QDs in one or more layers at the top of the CCTEL (FIG. 6), QDs in the bottom half of the CCTEL (FIG. 7), QDs in one or more layers at the bottom of the CCTEL (FIG. 8), or QDs randomly distributed in the CCTEL (FIG. 9).

FIG. 5A is a drawing depicting polymerization of a mixture of a cross-linkable charge transporting material and QDs in an organic solvent to form a QD layer on an outer surface of the crosslinked material in accordance with embodiments of the present application. The process shown in FIG. 5A depicts the QDs' 502 resultant position to form a QD layer 505 on an outer surface 507 (e.g. top) of the layer of the crosslinked material 506 thus forming a matrix that keeps the QDs in place.

In a specific embodiment, a mixture of a UV cross-linkable charge transporting material 501 and QDs 502 is provided in an organic solvent 503. QDs 502 have ligands with an active electrophilic center (or with an active center with adjacent substituent(s) that can stabilize a negative charge). The UV cross-linkable charge transporting material 501 can be polymerized 508 following an anionic mechanism. The mixture is deposited with a solution processable method on top of a substrate 504. A specific area of the deposited layer 509 is exposed to UV light. The cross-linkable material polymerizes, and the mixture becomes insoluble in the UV exposed area forming a layer of a desired thickness. The remaining materials are washed away via solvent treatment 511 with a solvent.

In an embodiment, after UV polymerization of a specific area, QDs 502 tend to position on the top outer surface 507 of the layer of the crosslinked material 506 thus forming a matrix that keeps the QDs 502 in place (FIG. 5A). If the layer is then subjected to solvent treatment 511 (spin rinsed, immersed, etc.), materials that were not UV polymerized are washed away and the final remaining structure of the polymerized area of the layer depends on the type and concentration of the ligands of the QDs.

For example, the UV cross-linkable charge transporting material 506 can be polymerized following an anionic mechanism if QDs 502 have ligands with active electrophilic centers (or with an active center with adjacent substituent(s) that can stabilize a negative charge). In another example, the UV cross-linkable charge transporting material can be polymerized following a cationic mechanism if QDs have ligands with active nucleophilic centers (or with an active center with adjacent substituent(s) that can stabilize a positive charge).

The ligands may be present in the solution (and in the final layer) in a concentration that allows for passivation of defects of the QDs, but that also allows for effective establishment of the crosslinked structure of the CCTEL. A ligand concentration that is too low may result in poor performance of the device due to defects of the QDs not being sufficiently passivated. A ligand concentration that is too high may result in a portion of the formed CCTEL (e.g., the portion of the layer distal the deposition surface) being washed away during processing. This may have a negative effect on both the ability to achieve a desired CCTEL thickness, and in some embodiments, on the performance of the CCTEL due to QDs of the formed layer being washed away. In some embodiments, the concentration of ligands either in the solution or in the final layer ranges from 10 to 45 wt %. In other embodiments, the concentration of ligands either in the solution or in the final layer ranges from 10 to 40%. In other embodiments, the concentration of ligands either in the solution or in the final layer ranges from 15 to 35%.

In some embodiments, the thickness of the formed CCTEL may be 10 nm to 250 nm. In other embodiments, the thickness of the formed CCTEL may be 10 nm to 150 nm. In other embodiments, the thickness of the formed CCTEL may be 10 nm to 100 nm.

For example, in an exemplary embodiment in which a predetermined range for ligand concentration is 15 to 35 wt % and the CCTEL is 100 nm as deposited and formed, prior to washing: if the concentration of ligands in the QDs 502 either in the solution or in the final layer ranges from 15 to 35 wt %, the thickness of the resulting CCTEL after washing may still be 100 nm. If the concentration of ligands in the QDs 502 either in the solution or in the final layer ranges from 35 to 40 wt % the thickness of the resulting CCTEL after washing may only be 75 nm due to a top portion of the layer being washed away. If the concentration of ligands in the QDs 502 either in the solution or in the final layer ranges from 40 to 45 wt % the thickness of the resulting CCTEL may only be 40 nm due to a top portion of the layer being washed away. If the concentration of ligands in the QDs 502 either in the solution or in the final layer is more than 45 wt % the thickness of the resulting CCTEL may be less than 10 nm due to a top portion of the layer being washed away. This is exemplified in FIGS. 5-9 and the graph in FIG. 10.

With reference to FIGS. 5B-5E, if the ligand concentration is high, the resulting layer will be thinner and it will be mainly constituted of the cross-linkable material 506 (FIG. 5E). When concentration of ligands either in the solution or in the final layer is above the predetermined amount, the final remaining structure of the polymerized area may not be ideal and may change with ligand concentration. In an example in which the ligand concentration falls within the predetermined range (e.g., 15 to 35 wt %), the QDs 502 positioned on an outer surface 507 of the layer 510 of the crosslinked material 506 forming a matrix may remain. However, increasing ligand content from the minimum to the maximum of this range results in a reduction in polymerization such that the material is not completely cross-linked (e.g., with an increasing number of small oligomers being formed). As shown in FIGS. 5C-5E, this may result in the material being more easily washed away, resulting the thickness of the CCTEL decreasing and the QDs being washed away.

As with the arrangement in FIG. 5 above, the UV cross-linkable charge transporting material can be polymerized following an anionic mechanism if QDs have ligands with active electrophilic centers (or with an active center with adjacent substituent(s) that can stabilize a negative charge). Furthermore, the UV cross-linkable charge transporting material can be polymerized following a cationic mechanism if QDs have ligands with active nucleophilic centers (or with an active center with adjacent substituent(s) that can stabilize a positive charge).

Like the arrangement in FIG. 5, the thickness in FIGS. 6A-9A may depend on the concentration of ligands. When concentration of ligands is within a predetermined range (e.g. 15-35 wt %), the final remaining structure of the polymerized area may remain intact upon washing (FIG. 6B-9B). Providing the ligand concentration within the predetermined range may lead to more uniform and better packed QDs layer. When concentration of ligands is outside of the predetermined range, the final remaining structure (e.g., the crosslinked structure) of the polymerized area is not ideal and changes with ligand concentration. More the ligand concentration is high, thinner the resulting layer will be (FIGS. 6C-9C, 6D-9D, 6E-9E).

The emissive and electrical properties of the CCTEL may be controlled by the final structure of the QDs arrangement within the cross-linked material. Ideal concentration and structure of the ligands may lead cross-linked material with improved properties, such as desirable charge transport properties.

FIGS. 6A-6E are drawings depicting polymerization of a mixture of a cross-linkable charge transporting material and QDs in an organic solvent to form a QD monolayer on an outer surface of the crosslinked material in accordance with embodiments of the present application. FIG. 6A is a drawing depicting polymerization of a mixture of a cross-linkable charge transporting material 601 and QDs 602 in an organic solvent 603 to form a QD monolayer 605 on an outer surface 607 of the crosslinked material 606. The process schematized in FIG. 6A, depicts the QDs' 602 resultant position to form a QD monolayer 605 on an outer surface 607 (e.g. top) of the layer of the crosslinked material 606 thus forming a matrix that keeps the QDs 602 in place. In this situation the final remaining structure of the polymerized area of the layer highly depends on the concentration of the ligands of the QDs 602. Even small variations from the predetermined ligand concentrations will cause the rinsing of QDs 602, with the final remaining structure mainly constituted of cross-linkable material. This structure is highly susceptible to ligand content of the QDs and the difference in remaining QDs after solvent treatment 611 can be seen by comparing FIGS. 5B and 5C with FIGS. 6B and 6C.

FIGS. 7A-7E are drawings depicting polymerization of a mixture of a cross-linkable charge transporting material 701 and QDs 702 in an organic solvent 703 to form a QD layer 705 at a bottom outer surface 707 of a crosslinked material 706 in accordance with embodiments of the present application. QDs 702 are formed on the bottom outer surface 707 of the layer of the crosslinked material 706 and disposed as multilayers. In this situation, the final remaining structure 712 of the polymerized area of the layer highly depends on the concentration of the ligands of the QDs 702. If there are small variations from the ideal ligand concentrations, this initially will cause mainly the rinsing of the cross-linkable material. As shown in FIGS. 7A-7E, there will only be partial rinsing of the QDs 702 by drastically increasing the ligand content of the QDs 702. This structure may be preferred for the fabrication of QLEDs with inverted structures. Small variations from the predetermined ligand content will not affect drastically the performance of the fabricated QLEDs. In exemplary embodiments, QDs 702 with a ligand concentration that is not ideal (e.g., in some embodiments, greater than 35 wt %) may achieve specific structures with a thinner cross-linked material layer 706. If the ligand concentration is lower than the predetermined range (e.g., 15 wt %), the QDs will not be completely passivated, thus they will not have high quantum yield.

FIGS. 8A-8E are drawings depicting polymerization of a mixture of a cross-linkable charge transporting material 801 and QDs 802 in an organic solvent 803 to form a QD monolayer 805 at a bottom outer surface 807 of a crosslinked material 806 in accordance with embodiments of the present application. QDs 802 are formed as a monolayer 805 on the bottom outer surface 807 of the layer of the crosslinked material 806. In this situation, the final remaining structure 812 of the polymerized area of the layer depends on the type and concentration of the ligands of the QDs 802. If there are small variations from the predetermined range of ligand concentrations, this initially will cause mainly the rinsing of the crosslinked material 806 as shown in FIGS. 8C and 8E during solvent treatment 811. In exemplary embodiments with high ligand content of the QDs 802, solvent treatment 811 will cause mainly the rinsing of the cross-linked material 806. This structure may be preferred for the fabrication of QLEDs with inverted structures. Small variations from the ideal ligand content will not affect drastically the performance of the fabricated QLEDs. In exemplary embodiments, QDs 802 with a ligand concentration that is outside the predetermined range (e.g., greater than 35 wt %) may achieve specific structures with a thinner cross-linked material layer 806. If the ligand concentration is lower than the predetermined range (e.g., 15 wt %), the QDs will not be completely passivated, thus they will not have high quantum yield.

FIGS. 9A-9E are drawings depicting polymerization of a mixture of a cross-linkable charge transporting material 901 and QDs 902 in an organic solvent 903 to form a layer 905 with QDs 902 randomly distributed in the layer 905 of a crosslinked material 907 in accordance with embodiments of the present application. QDs 902 randomly distributed within the thickness of the layer 905 of the crosslinked material 906. In this situation, the final remaining structure of the polymerized area of the layer 905 depends on the type and concentration of the ligands of the QDs. If there are variations from the ideal ligand concentrations, the remaining layer will have similar structure, but they will be thinner, with fewer QDs. Small variations from the ideal ligand content will affect the performance of the fabricated QLEDs.

Figure 10:
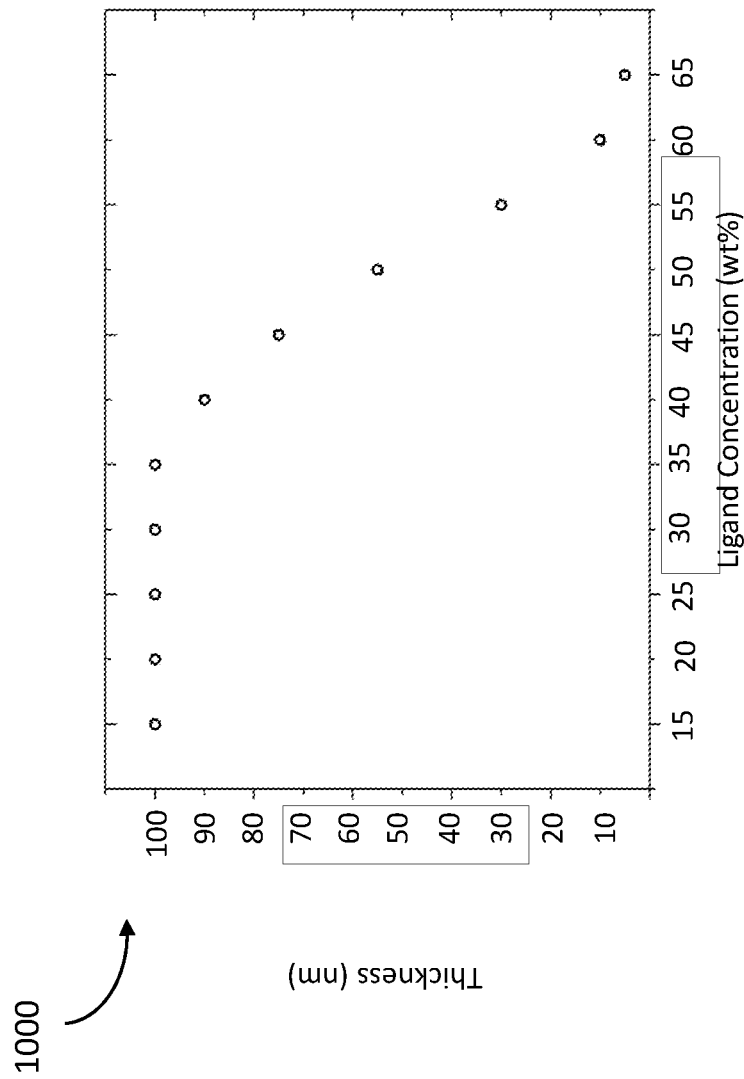
FIG. 10 is a graph representing the thickness of different CCTELs after solvent treatment versus the concentrations of ligands of the QDs, in accordance with embodiments of the present application.

FIG. 10 is a graph representing the thickness of different CCTELs after solvent treatment versus the concentrations of ligands of the QDs, in accordance with embodiments of the present application. The graph 1000 illustrates the relationship between the thickness (y-axis) of a layer including QDs and crosslinked material versus ligand concentration (x-axis). While the ligand concentration may dictate the thickness of the layer, a particular wt % that corresponds to a particular thickness may depend on one or more the QDs, the type of ligand, the type of cross-linkable material, the type of solvent, the activation stimulus, the solvent treatment, and the like.

The QDs can be segregated within the charge transport material during one or more of the steps of deposition and formation of the CCTEL. In some examples, such segregation or separation, for example, may occur due to different density, particle size, and/or interaction between the quantum dots and ligands versus the cross-linkable charge transport material. Additional description related to QD segregation is provided in U.S. patent application Ser. No. 16/519,329, filed on Jul. 23, 2019, the disclosure of which is hereby incorporated by reference in its entirety for all purposes. In other examples, such segregation or separation, for example, may occur due to the presence of nucleophilic and/or electrophilic properties at the deposition surface on which the CCTEL is formed.

Figure 11A:
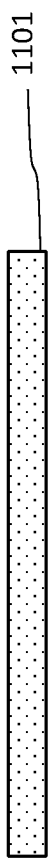

FIGS. 11A, 11B, 11C, 11D1, 11D2, 11D3, 11E1, 11E2, 11E3, 11E4, 11E5 and 11E6 are drawings depicting a progression of steps constituting an exemplary method of fabricating a light-emitting device in accordance with embodiments of the present application. As referenced above, the fabrication method is described principally in connection with a QLED example having a conventional structure (conventional structure having a first electrode 302 that is an anode and a second electrode 306 that is a cathode). Comparable principles may be applicable to other device examples described in this application. In this exemplary method, three different types of CCTEL can be produced: (i) a segregated crosslinked emissive layer (or at least a portion thereof) where the QDs dispose at the top outer surface of the cross-linkable material (FIG. 11E1); (ii) a segregated crosslinked emissive layer (or at least a portion thereof) where the QDs dispose at the bottom outer surface of the cross-linkable material (FIGS. 11E3, 11E6); (iii) a crosslinked emissive layer (or at least a portion thereof) where the QDs dispose randomly within the cross-linkable material (FIGS. 11E2, 11E5). As shown and described in the exemplary embodiment of FIG. 11, the emissive layer may be patterned by UV-exposing a desired area of the deposited layer. The patterned emissive layer may then be insoluble in the UV-exposed area, and the remaining materials may be removed, such as by being washed away with a solvent.

Figure 11B:
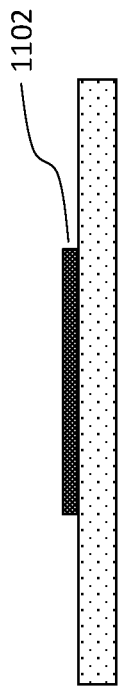

Referring to the steps illustrate in of FIGS. 11A-11E, at an initial step a substrate 1101 or comparable base layer is provided as shown in FIG. 11A. Next, as shown in FIG. 11B, a first electrode 1102 is deposited on the substrate 1101, and, thus, the base layer further may include an electrode. Additional charge transport layers may be deposited on the electrode and other base layers as described above with respect to other embodiments (e.g., charge transport layers 303 shown in FIG. 3). The base layer, therefore, further may include a hole transport layer having a cross-linkable hole transport material and the activation stimulus crosslinks the hole transport layer with the first portion of the CCTEL, or an electron transport layer having a cross-linkable electron transport material, and the activation stimulus crosslinks the electron transport layer with the first portion of the CCTEL.

Figure 11C:
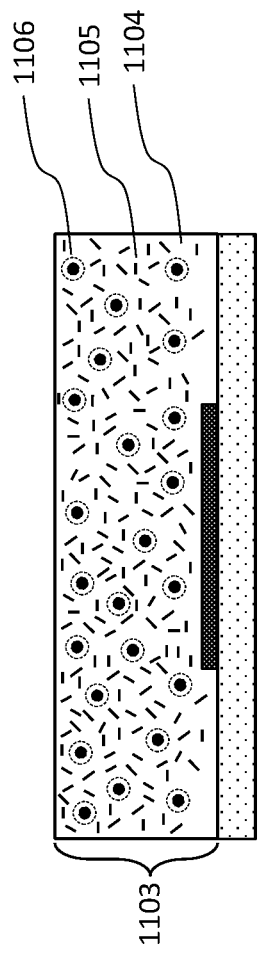

The electrode 1102 (or other base layer component) may be deposited on the substrate 1101 using any suitable method as are known in the art. Exemplary deposition methods for the electrode include sputtering, evaporative coating, printing, chemical vapor deposition, and the like. As described above, the deposited electrode 1102 may be provided in any suitable form, and one exemplary implementation is an electrode for a TFT circuit. As shown in FIG. 11C, a mixture 1103 including a cross-linkable material 1105, quantum dots 1106 and a solvent 1104 is deposited on the first electrode 1102 and the substrate 1101. In some embodiments, the mixture 1103 additionally includes a photo initiator, as described above. Between steps depicted in FIG. 11C and the UV-exposing step in FIGS. 11D1-11D2-11D3, some of the solvent may evaporate.

As shown in FIGS. 11D1, 11D2 and 11D3 ultraviolet (UV) light 1108 is applied through a mask 1107 that provides a shape or pattern through which the desired area of the mixture 1103 is exposed to the UV light 1108. Exposure of the mixture 1103 to the UV light results in the crosslinking of the cross-linkable material 1105. In embodiments in which the mixture also includes a photo initiator, the photo initiator may assist in initializing the cross-linking of the cross-linkable material. When a specific area of the deposited layer is exposed to UV light, the photo initiator may initiate the polymerization of the cross-linkable material.

FIGS. 11E1, 11E2, and 11E3 depict exemplary CCTEL layers with the concentration of ligands in an ideal range as described herein. In the variation of the process through FIGS. 11D1 to 11E1 and 11E3, the QDs 1106 tend to remain distributed within the cross-linkable material 1105 during the deposition process, with the UV exposure 1108 causing the major portion of the phase separation. In the variation of the process through FIG. 11D2 or 11D3 and FIG. 11E1 or 11E3 respectively, the QDs 1106 tend to segregate during the deposition process as the solvent 1104 evaporates. In the variation of the process through FIGS. 11D1 to 11E2, the QDs 1106 tend to remain distributed within the cross-linkable material 1105 during the deposition process, with the UV exposure 1108 fixes the QDs 1106 randomly in place. The variations may occur to some degree in combination. In all such variations, the UV exposure 1108 polymerizes the crosslinked material 1110, which fixes the phase separation that is depicted in the resultant FIGS. 11E1-11E3.

FIG. 11E1 depicts a segregated CCTEL layer 1120, whereby the crosslinking of the cross-linkable material 1105 results in phase separation of the QDs 1106 in a QD layer 1109 at the outer top surface of the crosslinked material 1110. In the segregated CCTEL layer 1120, the QDs will become positioned within the CCTEL adjacent to or at an outer surface layer, e.g., the top surface layer, to form the QD layer 1109. The QDs will be immobilized within the QD layer 1109 from traveling throughout the formed crosslinked matrix 1110 that is composed of the remainder of the crosslinked material 1105. The segregated CCTEL layer 1120, therefore, is composed of a first portion, e.g., QD layer 1109, mainly composed of QDs, which may be a monolayer of QDs, which has emissive properties thus constituting an emissive portion of the CCTEL layer. And, the segregated CCTEL layer 1120 includes a second portion mainly composed of the cross-linked material 1110 which has charge transporting and/or injecting and/or blocking properties. Accordingly, the first portion also is referred to as the emissive portion 1109 of the CCTEL 1120, and the second portion may be referred to as the charge manipulation portion 1110 of the CCTEL 1120.

FIG. 11E2 depicts a CCTEL layer 1121, whereby the QDs 1106 form a randomly dispersed QD layer 1111 in the crosslinked material 1110.

FIG. 11E3 depicts a segregated CCTEL layer 1122, whereby the crosslinking of the cross-linkable material 1105 results in phase separation of the QDs 1106 in the bottom surface of the crosslinked material 1110 to form a QD layer 1109 close to the electrode 1102. In the segregated CCTEL layer 1122, the QDs 1106 will become positioned within the CCTEL layer 1122 adjacent to or at an outer surface layer, e.g., the bottom surface layer, to form a QD layer 1109. The QDs 1106 will be immobilized within the QD layer 1109 from traveling throughout the formed crosslinked material 1110 that is composed of the remainder of the cross-linkable material 1105. The segregated CCTEL layer 1122, therefore, is composed of a first portion mainly composed of the cross-linked material 1110, which has charge transporting and/or injecting and/or blocking properties, and a second portion mainly composed of QDs, which may be a QD layer 1109 or monolayer of QDs, which has emissive properties thus constituting an emissive portion of the CCTEL layer 1122. Accordingly, the first portion may be referred to as the charge manipulation portion 1110 of the CCTEL 1120, and the second portion also is referred to as the emissive portion 1109 of the CCTEL 1120.

FIGS. 11E4, 11E5, and 11E6 depict exemplary CCTEL layers if the concentration of the ligands of the QDs is higher than the predetermined (ideal) range. FIG. 11E4 depicts a crosslinked material layer 1123 constituted mainly from the crosslinked material, derived from the layer 1120 shown in FIG. 11E1 but where the upper portion of the layer removed after washing with a solvent. FIG. 11E5 depicts a CCTEL layer 1124 constituted from a randomly dispersed quantum dot layer 1111 in the crosslinked material 1110, derived from the layer CCTEL 1121 shown in FIG. 11E2 but where the upper portion of the layer removed after washing with a solvent. FIG. 11E6 depicts a segregated CCTEL layer 1125 whereby the crosslinking of the cross-linkable material 1105 results in phase separation of the QDs 1106 in the bottom surface of the crosslinked material close to the electrode 1102, derived from the CCTEL layer 1122 shown in FIG. 11E3 but where the upper portion of the layer removed after washing with a solvent.

FIG. 11E4-11E6 are analogous of FIG. 11E1-11E3 where the upper portion of the layer is removed after washing with a solvent due to the high concentration of ligands in the QDs that caused incomplete polymerization of the cross-linkable material.

As further shown in FIG. 11E1-11E6, the remaining mixture 1103 that had been masked by the mask 1107 of FIG. 11D1/11D2/11D3 (and thus not exposed to the UV light 1108) may be washed away with a solvent. This, as described above, can lead to different combinations of the CCTELs with the emissive portion 1109 and the charge manipulation (charge transporting and/or injecting and/or blocking) portion 1110 remaining on the substrate 1101 depending on the concentration of the ligands of the QDs. The CCTEL solubility in the solvent following the UV exposure 1108, depends on the efficiency of the polymerization or, in other words, on the average molecular weight reached from the polymer. If the polymerization is not efficient because the concentration of the ligands of the QDs is too high and the free ligands quench (at least in part) the polymerization, two cases are possible: (i) part of or, (ii) all of the CCTEL obtained after UV exposure, can be washed away with the solvent. In the first case, CCTELs such as the ones shown in FIG. 11E4/11E5/11E6 can be obtained, in the second case the CCTEL can be completely washed away.

In some embodiments, the solvent is the same solvent used in the mixture 1103 that is deposited in FIG. 11C. In other embodiments, the solvent is a similar solvent or orthogonal solvent to the solvent used in the mixture 1103 that is deposited in FIG. 11C. Accordingly, as shown in FIG. 11E1-11E6, the combination of emissive portion 1109 and charge manipulation portion 1110 remains on the first electrode 1102. The solvent used in the mixture 1103 and/or the solvent used to wash away the remaining mixture may be evaporated during annealing (e.g., heating) of the deposited layer. The annealing may be performed at any suitable temperature that effectuates evaporation of the solvent while also maintaining the integrity of the quantum dots and charge transport material. In exemplary embodiments, annealing may be performed at a temperature ranging from 5° C. to 150° C., or at a temperature ranging from 30° C. to 150° C., or at a temperature ranging from 30° C. to 100° C.

In an exemplary embodiment, subsequent to the application of UV light as shown in FIGS. 11D1/11D2/11D3, the layer may be annealed (e.g., heated) to facilitate evaporation and removal of the solvent(s). This annealing may be performed prior to the washing or subsequent to the washing. In implementations in which the annealing is performed prior to the washing, a subsequent annealing may be performed after washing. As another example, application of UV light as shown in FIGS. 11D1/11D2/11D3 and annealing (e.g., heating) may be performed in parallel. This may remove the solvent used in the mixture 1103. Subsequent to the washing, a subsequent annealing may be performed. Additionally, annealing may be conducted prior to application of UV light as shown in FIGS. 11D1/11D2/11D3, and subsequent to the washing, a subsequent annealing may be performed.

The morphology of the emissive material may be controlled using one or more of UV exposure times, UV-intensity, amount of photo initiator, ratio between QDs and cross-linkable material, concentration of the ligands of the QDs, total concentration of the mixture, and the like. For example, UV exposure time may range from 0.001 seconds to 15 minutes, and/or UV exposure intensity may range from 0.001 to 100,000 mJ/cm$^2$. The amount of photo initiator may range from 0.001 to 15 wt % of the total concentration of the QDs and the cross-linkable material in the mixture. The ratio between QDs and cross-linkable material may range from 0.001 to 1, and the total concentration of the QDs and the cross-linkable material in the mixture may range from 0.1 to 20 wt %. The concentration of the ligands of the QDs may range from 10 to 35 wt %. In an exemplary embodiment, the UV exposure intensity ranges from 0.01 to 100 mJ/cm$^2$ at a UV exposure time of 0.01 to 200 seconds, the total concentration of the QDs and the cross-linkable material in the mixture ranges from 0.5 to 10 wt %, the ratio between QDs and cross-linkable material ranges from 0.01 to 0.5, and the photo initiator concentration ranges from 0.1 to 5 wt % of the total concentration of the QDs and the cross-linkable material in the mixture.

Using an approach such as that described above, different subpixels (e.g., R, G and B) can be patterned on a given substrate in a manner that delineates the areas in which the materials that constitute the QLED subpixel structures are deposited. Combined charge transporting and emissive layers containing QDs emitting different wavelengths can be cross-linked by light irradiation in specific areas (not cross-linked material can be removed by solvent rinsing) making them patternable. Patternability and morphology of the final films depends on the concentration of the ligands of the QDs. Ideal concentration and structure of the ligands may lead to patterned layers with improved properties.

Furthermore, in exemplary embodiments, one or more activation stimuli in addition to or other than UV can be used. Examples include pressure, heat, a second exposure of light (this can be in the UV range or other ranges such as Visible or IR), and change in pH. Accordingly, in some embodiments, the method of producing the crosslinked emissive layer as described with respect to FIGS. 11A-11E may be modified, for example, with respect to the phase separation step shown in FIGS. 11D1/11D2/11D3. For example, instead of the application of UV light as the activation stimulus, the crosslinking step may include instead or additionally one or more activation stimuli including the application of pressure, increase in temperature, and/or an addition to the mixture 1103 to provide a change in pH. Application of any activation stimulus or combination thereof may provide for formation of the segregated matrix that constitutes the CCTEL.

The following constitutes variations on the above methods, which further may be employed individually or in combination as may be suitable for any particular application. An exemplary embodiment may include an anode and cathode and layered CCTEL 307/1120 as described above. In such embodiment, the cross-linkable material has hole injection/transporting properties and is adjacent to the anode. In another exemplary embodiment, the cross-linkable material has electron injection/transporting properties and is adjacent to the cathode. In another exemplary embodiment, there is one or more additional electron injection/transporting layers between the CCTEL 307/1120 and the cathode. In another exemplary embodiment, there is one or more additional hole injection/transporting layers between the CCTEL 307/1120 and the anode.

Exemplary materials used to form various QLED layers described herein include, but are not limited to, the following. The electron transport and/or electron injection layers may include individual or combinations of: ZnO, 8-quinolinolato lithium (Liq.), LiF, $Cs_2CO_3$, $Mg_xZn_{1-x}O$, $Al_xZn_{1-x}O$, 2,2',2"-(1,3,5-benzinetriyl)-tris(1-phenyl-1-H-benzimidazole) (TPBi), $TiO_2$, $ZrO_2$, N4,N4'-Di(naphthalen-1-yl)-N4,N4'-bis(4-vinylphenyl)biphenyl-4,4'-diamine (VNPB), 9,9-Bis[4-[(4-ethenylphenyl)methoxy]phenyl]-N2,N7-di-1-naphthalenyl-N2,N7-diphenyl-9H-Fluorene-2,7-diamine (VB-FNPD), where $0 \leq x \leq 1$. The EML my include: QD nanoparticles which include one or more of: InP, CdSe, CdS, $CdSe_xS_{1-x}$, CdTe, $Cd_xZn_{1-x}Se$, $Cd_xZn_{1-x}Se_yS_{1-y}$, ZnSe, ZnS, ZnSTe, ZnSeTe, perovskites of the form $ABX_3$, $Zn_wCu_zIn_{1-(w+z)}S$, carbon, where $0 \leq w, x, y, z \leq 1$ and $(w+z) \leq 1$. The hole transport and/or hole injection layers may include individual or combinations of: poly(3,4-ethylenedioxythiophene):poly(styrenesulfonate) (PEDOT:PSS), poly(9,9-dioctylfluorene-co-N-(4-sec-butylphenyl)-diphenylamine) (TFB), poly(9-vinylcarbazole) (PVK), poly(N,N'-bis(4-butylphenyl)-N,N'-bisphenylbenzidine) (PolyTPD), $V_2O_5$, NiO, CuO, $WO_3$, $MoO_3$, 2,3,5,6-tetrafluoro-7,7,8,8-tetracyanoquinodimethane (F4TCNQ), 1,4,5,8,9,11-hexaazatriphenylenehexacarbonitrile (HATCN), N4,N4'-Bis(4-(6-((3-ethyloxetan-3-yl)methoxy)hexyl)phenyl)-N4,N4'-diphenylbiphenyl-4,4'-diamine (OTPD), N4,N4'-Bis(4-(6-((3-ethyloxetan-3-yl)methoxy)hexyloxy)phenyl)-N4,N4'-bis(4-methoxyphenyl)biphenyl-4,4'-diamine (QUPD), N,N'-(4,4'-(Cyclohexane-1,1-diyl)bis(4,1-phenylene))bis(N-(4-(6-(2-ethyloxetan-2-yloxy)hexyl)phenyl)-3,4,5-trifluoroaniline) (X-F6-TAPC), 3,5-di-9H-carbazol-9-yl-N,N-bis[4-[[6-[(3-ethyl-3-oxetanyl)methoxy]hexyl]oxy]phenyl]-benzenamine (Oxe-DCDPA).

The above-described methods are described as producing a single light-emitting device. It will be appreciated that the patterning of the mask may allow for producing multiple light-emitting devices to be formed in different regions of the substrate and may form an array of light-emitting devices. Furthermore, any of the above-described methods can be repeated to form light-emitting devices having different QDs, such as for example different QDs that emit different colors of light (e.g. R, G, B) in different regions of the structure, as determined by the patterning of the mask. The arrangement of light-emitting devices may form sub-pixel arrangements and pixel arrangements of sub-pixels.

In exemplary embodiments, light-emitting devices may be arranged such that the light-emitting devices are separated at least in part by one or more insulating materials. This arrangement may also be referred to as a "bank structure."

Figure 12A:
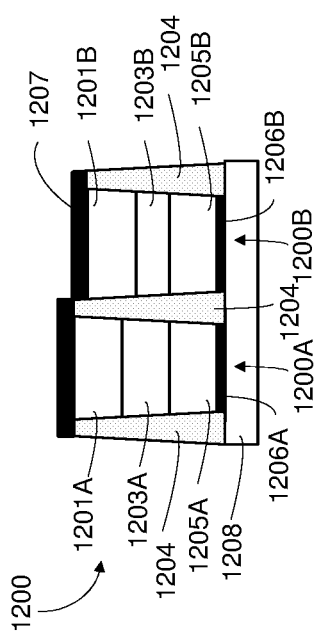
FIGS. 12A and 12B are drawings depicting an arrangement of multiple light-emitting devices formed in accordance with embodiments of the present application.
Figure 12B:
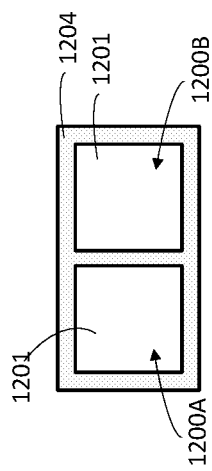

FIGS. 12A and 12B are drawings depicting a bank structure 1200 of multiple light-emitting devices formed in accordance with embodiments of the present application, with FIG. 12A illustrating a cross-section view and FIG. 12B illustrating a top view. As shown in the figures, first and second subpixels 1200A and 1200B are patterned on the same substrate 1208 and an insulating material 1204 delineates the areas in which the materials that constitute the QLED subpixel structures of devices 1200A and 1200B are deposited. FIGS. 12A and 12B illustrate an exemplary arrangement of two light-emitting devices arranged as sub-pixels, although any suitable number of light-emitting devices may be deposited in such arrangement (e.g., three light-emitting devices, four light-emitting devices, etc.). The different subpixels may be configured to emit light of different colors. Exemplary insulating materials 1204 may include, but are not limited to, polyimides.

In some examples, the insulating material may include a surface treatment, such as for example fluorine, to modify the insulating material wetting properties. For example, the insulating material may be made hydrophilic to prevent the deposited material from sticking on the banks and to ensure the subpixel is filled properly. The insulating material 1204 thus forms wells and the bottoms may include different electrodes (e.g., anodes) for each subpixel. In the embodiment shown, the light-emitting devices include first electrodes 1206A and 1206B, a second electrode 1207 which may be common to both (or all) light-emitting devices in the bank structure, first charge transport layers 1205A and 1205B, CCTELs 1203A and 1203B, and second charge transport layers 1201A and 1201B, such that each light-emitting device 1200A and 1200B may be configured generally similar to the embodiment depicted in FIG. 3. The bank structure may include light-emitting devices configured and/or fabricated in accordance with any of the embodiments.

In an exemplary embodiment, the light emitting devices of the bank structure 1200 are top-emitting devices and thus the first electrodes 1206A and 1206B are anodes and the second electrode 1207 is a cathode (and again the cathode may be common between subpixels 1200A and 1200B). The first charge transport layers 1205A and 1205B are preferably deposited commonly (i.e. to both sub-pixels at the same time and with the same material and thickness), but alternatively may be deposited individually (i.e. patterned) for the different subpixels. The CCTEL 1203A includes a first QD type with a first emission wavelength, and the CCTEL 1203B includes a second QD type with a second emission wavelength different from the first emission wavelength. The second charge transport layers 1201A and 1201B are preferably deposited commonly (i.e. to both sub-pixels at the same time and with the same material and thickness), but alternatively may be deposited individually (i.e. patterned) for the different subpixels.

It is known that for top-emitting devices that include reflective electrodes (e.g. the first electrodes 1206A, 1206B) and partially reflective electrodes (e.g. the second electrode 1207), an optical cavity can be established for the light emitted from QDs by electroluminescence. The distance between the QDs emitting light and the first electrode, and the distance between the QDs emitting light and the second electrode, can have a significant effect on the optical mode of the cavity, and consequently on the properties of the light emitted through the second electrode 1207. For example, such parameters can affect the efficiency of light escaping from the light emitting device, and the dependence of intensity and wavelength on emission direction. Therefore, it is often preferable to select the thickness of layers disposed between the QDs and the electrodes to provide a favorable optical cavity for optimal light efficiency. Suitable thicknesses are different for different wavelengths of light (e.g. different between a device emitting red light and a device emitting green light).

A significant advantage of the CCTEL of types described in connection with FIGS. 4B-4G, and especially for the layered distribution of QDs in FIGS. 4C, 4D, 4F and 4G, is that the distance between the quantum dots and the pertinent electrode can be selected according to the thickness of the CCTEL. For example, referring to FIG. 12A, wherein the first electrodes 1206A and 1206B are anodes, with a CCTEL 1203A and 1203B configured as in FIG. 4C or 4D in which the charge transport material of the CCTEL is a hole transporting layer, the distance between the quantum dots and the reflective anode may be adjusted by adjusting the overall thickness of the CCTEL. Consequently, as illustrated in FIG. 12A, the CCTEL 1203A and CCTEL 1203B may be provided with different thicknesses to provide favorable distances between the quantum dots and the anode as individually required for the wavelength of light emitted from the quantum dots in CCTEL 1203A and for the wavelength of light emitted from the quantum dots in CCTEL 1203B, respectively. Therefore, favorable optical cavity length and different wavelengths are achieved by depositing only the CCTEL individually between the subpixels. It is not necessary to deposit other charge transport layers individually between the sub-pixels to provide the suitable distance between the quantum dots and the reflective electrode. In an example, only the CCTEL is deposited individually between the subpixels and all other layers are deposited commonly to the two subpixels. In another example, the light emitting devices of the bank structure 1200 are bottom emitting devices, for which the distance between the emitting quantum dots and the reflective electrode can affect the light emission due to cavity effects. Therefore, for bottom emitting devices CCTEL of the type depicted in FIG. 4F or 4G is advantageous for comparable reasons.

An example of a light-emitting device may be produced as follows in accordance with another embodiment of the present application. 150 nm of ITO is sputtered through a shadow mask onto a 1 mm thick glass substrate to define a semi-transparent anode region. PEDOT:PSS in aqueous solution is deposited on top of the anode by spin coating then baked at 150° C. to form a hole injection layer. InP quantum dots, a cross-linkable material with hole transporting properties, and a photo initiator are deposited and patterned by the above-described deposition method exemplified in FIGS. 11A-11E. MgZnO nanoparticles are deposited on top of the emissive layer by spin coating from ethanol followed by baking at 80° C. to form an electron transport layer. Next, 100 nm of Aluminum is thermally evaporated on top of the electron transport layer to provide a reflective cathode. The above-described process yields a light-emitting device having a 1 mm glass substrate; a 150 nm ITO anode; a 50 nm PEDOT:PSS hole injection layer; a CCTEL including a 60 nm portion composed mainly of the crosslinked hole transporting material that acts as a hole transporting layer, and a 15 nm portion mainly composed of QDs that act as emissive layer; a 60 nm MgZnO electron transport layer; and a 100 nm Al cathode.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

INDUSTRIAL APPLICABILITY

The present invention relates to QD-LED devices that, for example, may be used for light-emitting elements in a display device. Embodiments of the present invention are applicable to many display devices to permit display devices of high resolution and high image quality. Examples of such devices include televisions, mobile phones, personal digital assistants (PDAs), tablet and laptop computers, desktop monitors, digital cameras, and like devices for which a high-resolution display is desirable.

REFERENCE SIGNS LIST

101—QD core
102—QD shell
103—QD ligands
104—QD core+shell
105—QD
200—QD-LED structure
201—substrate
202—first electrode
203—first charge transport layers
204—emissive layer
205—second charge transport layers
206—second electrode
300—QD-LED structure
301—substrate
302—first electrode
303—first charge transport layers
305—second charge transport layers
306—second electrode 307—combined charge transport and emissive layer (CCTEL)
401—quantum dots
402—charge transport material
403—underlayer
404—cluster
405—upper half portion
406—upper outer surface
407—monolayer
408—lower half portion
409—lower outer surface
410—monolayer
501—cross-linkable material
502—QDs
503—solvent
504—substrate
505—layer of QDs
506—crosslinked material
507—top outer surface
508—polymerization
509—deposited layer
510—final thickness
511—solvent treatment
601—cross-linkable material
602—QDs
603—solvent
604—substrate
605—monolayer of QDs
606—crosslinked material
607—top outer surface
608—polymerization
611—solvent treatment
701—cross-linkable material
702—QDs
703—solvent
704—substrate
705—layer of QDs
706—crosslinked material
707—bottom outer surface
708—polymerization
711—solvent treatment
712—remaining structure
801—cross-linkable material
802—QDs
803—solvent
804—substrate
805—layer of QDs
806—crosslinked material
807—bottom outer surface
808—polymerization
811—solvent treatment
812—remaining structure
901—cross-linkable charge transporting material
902—QDs
903—solvent
904—substrate
905—randomly distributed layer of QDs
906—crosslinked material
908—polymerization
911—solvent treatment
912—remaining structure
1000—graph
1101—substrate
1102—first electrode
1103—mixture
1104—solvent
1105—cross-linkable material
1106—quantum dots
1107—mask
1108—ultraviolet light
1109—quantum dot layer
1110—crosslinked material
1111—Randomly dispersed quantum dot layer
1120—CCTEL layer
1121—CCTEL layer
1122—CCTEL layer
1123—crosslinked material layer
1124—CCTEL layer
1125—CCTEL layer
1200—bank structure
1200A—first subpixel
1200B—second subpixel
1201A—second charge transport layer A
1201B—second charge transport layer B
1203A—CCTEL A
1203B—CCTEL B
1204—insulating material
1205A—first charge transport layer A
1205B—first charge transport layer B
1206A—first electrode A
1206B—first electrode B
1207—second electrode
1208—substrate

The invention claimed is:

1. A light-emitting device, comprising:
an anode;
a cathode; and
a crosslinked emissive layer disposed between the anode and the cathode in which quantum dots are dispersed, the crosslinked emissive layer comprising a crosslinked material and quantum dots dispersed in the crosslinked material, the quantum dots having ligands respectively bonded to the quantum dots;
wherein the quantum dots are distributed unevenly within the crosslinked material;
wherein the ligands have a concentration relative to the weight of the quantum dots in a range of 10 to 45 wt %; and
wherein at least 75% of the quantum dots are located in a half portion of a combined charge transport and emissive layer closest to the cathode.

2. The light-emitting device of claim 1, wherein the ligands have nucleophilic or electrophilic centers.

3. The light-emitting device of claim 1, wherein the ligands have a concentration relative to the weight of the quantum dots in a range of 15 to 35 wt %.

4. The light-emitting device of claim 1, wherein the crosslinked material comprises a hole transport material and the crosslinked emissive layer is the combined charge transport and emissive layer.

5. The light-emitting device of claim 1, wherein the crosslinked material comprises an electron transport material and the crosslinked emissive layer is the combined charge transport and emissive layer.

6. The light-emitting device of claim 1, further comprising a hole transport layer disposed between the anode and the crosslinked emissive layer.

7. The light-emitting device of claim 1, further comprising an electron transport layer disposed between the cathode and the crosslinked emissive layer.

8. A light-emitting device of claim 1, comprising:
an anode;
a cathode; and
a crosslinked emissive layer disposed between the anode and the cathode in which quantum dots are dispersed, the crosslinked emissive layer comprising a crosslinked material and quantum dots dispersed in the crosslinked material, the quantum dots having ligands respectively bonded to the quantum dots;
wherein the quantum dots are distributed unevenly within the crosslinked material;
wherein the ligands have a concentration relative to the weight of the quantum dots in a range of 10 to 45 wt %; and
wherein the quantum dots form a monolayer of quantum dots at an outer surface of the crosslinked emissive layer closest to the cathode.

9. The light-emitting device of claim 8, wherein the ligands have nucleophilic or electrophilic centers.

10. The light-emitting device of claim 8, wherein the ligands have a concentration relative to the weight of the quantum dots in a range of 15 to 35 wt %.

11. The light-emitting device of claim 8, wherein the crosslinked material comprises a hole transport material and the crosslinked emissive layer is the combined charge transport and emissive layer.

12. The light-emitting device of claim 8, wherein the crosslinked material comprises an electron transport material and the crosslinked emissive layer is the combined charge transport and emissive layer.

13. The light-emitting device of claim 8, further comprising a hole transport layer disposed between the anode and the crosslinked emissive layer.

14. The light-emitting device of claim 8, further comprising an electron transport layer disposed between the cathode and the crosslinked emissive layer.

15. A light-emitting device, comprising:
an anode;
a cathode; and
a crosslinked emissive layer disposed between the anode and the cathode in which quantum dots are dispersed, the crosslinked emissive layer comprising a crosslinked material and quantum dots dispersed in the crosslinked material, the quantum dots having ligands respectively bonded to the quantum dots;
wherein the quantum dots are distributed unevenly within the crosslinked material;
wherein the ligands have a concentration relative to the weight of the quantum dots in a range of 10 to 45 wt %; and
wherein at least 75% of the quantum dots are located in a half portion of a combined charge transport and emissive layer closest to the anode.

16. The light-emitting device of claim 15, wherein the ligands have nucleophilic or electrophilic centers.

17. The light-emitting device of claim 15, wherein the ligands have a concentration relative to the weight of the quantum dots in a range of 15 to 35 wt %.

18. The light-emitting device of claim 15, wherein the crosslinked material comprises a hole transport material and the crosslinked emissive layer is the combined charge transport and emissive layer.

19. The light-emitting device of claim 15, wherein the crosslinked material comprises an electron transport material and the crosslinked emissive layer is the combined charge transport and emissive layer.

20. The light-emitting device of claim 15, further comprising a hole transport layer disposed between the anode and the crosslinked emissive layer.

* * * * *